(12) United States Patent
Kuratomi et al.

(10) Patent No.: US 8,476,113 B2
(45) Date of Patent: Jul. 2, 2013

(54) METHOD OF MANUFACTURING SEMICONDUCTOR DEVICE

(75) Inventors: Bunshi Kuratomi, Kanagawa (JP); Fukumi Shimizu, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 202 days.

(21) Appl. No.: 13/160,653

(22) Filed: Jun. 15, 2011

(65) Prior Publication Data

US 2012/0009737 A1 Jan. 12, 2012

(30) Foreign Application Priority Data

Jul. 6, 2010 (JP) .................................. 2010-153973

(51) Int. Cl.
*H01L 21/00* (2006.01)

(52) U.S. Cl.
USPC .......................................... 438/112; 438/127

(58) Field of Classification Search
USPC ................................................ 438/106–127
See application file for complete search history.

(56) References Cited

U.S. PATENT DOCUMENTS

| 6,809,405 | B2 | 10/2004 | Ito et al. |
| 7,044,726 | B2 * | 5/2006 | Koyama et al. ............ 425/192 R |
| 7,048,535 | B2 * | 5/2006 | Takanohashi ................. 425/593 |
| 2006/0125064 | A1 | 6/2006 | Ito et al. |

FOREIGN PATENT DOCUMENTS

| JP | 59-105326 A | 6/1984 |
| JP | 2000-218660 A | 8/2000 |
| JP | 2003-243600 A | 8/2003 |
| JP | 2004-214233 A | 7/2004 |

* cited by examiner

*Primary Examiner* — Richard Booth
(74) *Attorney, Agent, or Firm* — Mattingly & Malur, PC

(57) ABSTRACT

When chip-scale molding system is employed for QFP, the number of semiconductor devices available from a leadframe decreases because cavities each requires a runner portion. This problem can be overcome by employing MAP system, but use of a laminate tape increases the production cost. In through mold system, each cavity needs an ejector pin, which however makes it difficult to place a support pillar. The present application provides a manufacturing method of a semiconductor device by filling, while sandwiching a leadframe between mold dies having a matrix-state cavity group in which cavity columns obtained by linking mold cavities in series via a through gate have been placed in rows, a sealing resin in the cavities. In this method, the matrix-state cavity group has, at the cavity corner portions thereof, a support pillar having a cross-section striding over all the cavities adjacent to the cavity corner portions when viewed planarly.

16 Claims, 23 Drawing Sheets

METHOD OF MANUFACTURING SEMICONDUCTOR DEVICE

CROSS-REFERENCE TO RELATED APPLICATIONS

The disclosure of Japanese Patent Application No. 2010-153973 filed on Jul. 6, 2010 including the specification, drawings and abstract is incorporated herein by reference in its entirety.

BACKGROUND

The present invention relates to a technology effective when applied to a resin sealing technology in a manufacturing method of a semiconductor device (or a semiconductor integrated circuit device).

Japanese Patent Laid-Open No. Sho 59(1984)-105326 (Patent Document 1) discloses, in transfer molding of a semiconductor device or the like, a resin molding apparatus having an auxiliary support pillar provided therein between columns of a cavity pair placed opposite to each other with a runner, which is a supply route of a resin, in common.

Japanese Patent Laid-Open No. 2000-218660 (Patent Document 2) discloses, in transfer molding of a semiconductor device or the like, a resin molding apparatus having a mold die structure in which runners serving as a supply route of a resin are linked to cavities, respectively, and at the same time, support pillars of a bottom mold die provided at the center of each of the cavities and between the cavities.

Japanese Patent Laid-Open No. 2004-214233 (Patent Document 3) or U.S. Patent Application Publication No. 2006-125064 (Patent Document 4) corresponding thereto discloses, in transfer molding of a QFN (quad flat non-leaded package) type semiconductor device or the like, a through mold technology of providing a conduction path (so-called through gate) of a molten resin between cavities.

Japanese Patent Laid-Open No. 2003-243600 (Patent Document 5) or U.S. Pat. No. 6,809,405 (Patent Document 6) corresponding thereto discloses, in transfer molding of a QFN type semiconductor device or the like in which external terminals on the bottom surface of a package are arranged in a zigzag manner, a through mold technology of providing a conduction path of a molten resin between cavities.

[Patent Document 1] Japanese Patent Laid-Open No. Sho 59(1984)-105326
[Patent Document 2] Japanese Patent Laid-Open No. 2000-218660
[Patent Document 3] Japanese Patent Laid-Open No. 2004-214233
[Patent Document 4] U.S. Patent Application Publication No. 2006-125064
[Patent Document 5] Japanese Patent Laid-Open No. 2003-243600
[Patent Document 6] U.S. Pat. No. 6,809,405

SUMMARY

According to the investigation by the present inventors, when a chip-scale molding system using a mold die equipped with a cavity for covering therewith each of semiconductor chips mounted on a leadframe is employed, a region corresponding to a runner portion for supplying a resin to each of the cavities should be provided on the side of the leadframe, which leads to a reduction in the number of semiconductor devices available from a leadframe due to an increase in the region corresponding to the runner portion.

The number of semiconductor devices available from one leadframe can be increased by employing a MAP (mold array package) system in which a plurality of semiconductor chips is sealed simultaneously in one cavity. The MAP system, however, increases a production cost because a laminate tape is used in consideration of the release properties from a mold die.

The present inventors therefore investigated use of a through mold system in which two adjacent cavities are linked via a through gate portion and a resin supplied to one of the cavities is supplied to the other cavity via the through gate portion. In this case, the cavities should each be provided with an ejector pin in order to ensure good release properties. It has however been elucidated that the ejector pin provided in the cavity interferes with the placement of a support pillar (support for retaining a mold die).

The present invention has been made in order to overcome the above-described problems.

An object of the invention is to provide a highly reliable manufacturing process of a semiconductor device.

These and other objects and novel features of the invention will be apparent from the description herein and accompanying drawings.

Of the inventions disclosed herein, typical ones will next be outlined briefly.

In one aspect of the invention, there is provided a manufacturing method (so-called SEMI-MAP system) of a semiconductor device which includes a step of, while sandwiching a leadframe between mold dies having a matrix-state cavity group in which a plurality of cavity columns having a plurality of mold cavities linked in series via a through gate have been arranged in rows, filling a sealing resin in each of the cavities and thereby sealing a semiconductor chip housed in each of the cavities. In this method, in a planar view parallel to the main surface of the leadframe, a support pillar having a cross-section striding over all the cavities to which the cavity corner portion is adjacent is placed at the cavity corner portion of the matrix-state cavity group.

Advantages available by the typical invention, among the inventions disclosed herein, will next be described briefly.

Described specifically, in a manufacturing method of a semiconductor device which includes a step of, while sandwiching a leadframe between mold dies having a matrix-state cavity group in which a plurality of cavity columns having a plurality of mold cavities linked in series via a through gate have been arranged in rows, filling a sealing resin in each of the cavities and thereby sealing a semiconductor chip housed in each of the cavities, a support pillar having a cross-section striding over all the cavities to which the cavity corner portion is adjacent is placed at the cavity corner portion of the matrix-state cavity group when viewed from a plane parallel to the main surface of the lead frame so that deformation of mold dies which will otherwise occur upon resin sealing can be effectively prevented.

DETAILED DESCRIPTION

Figure 1:
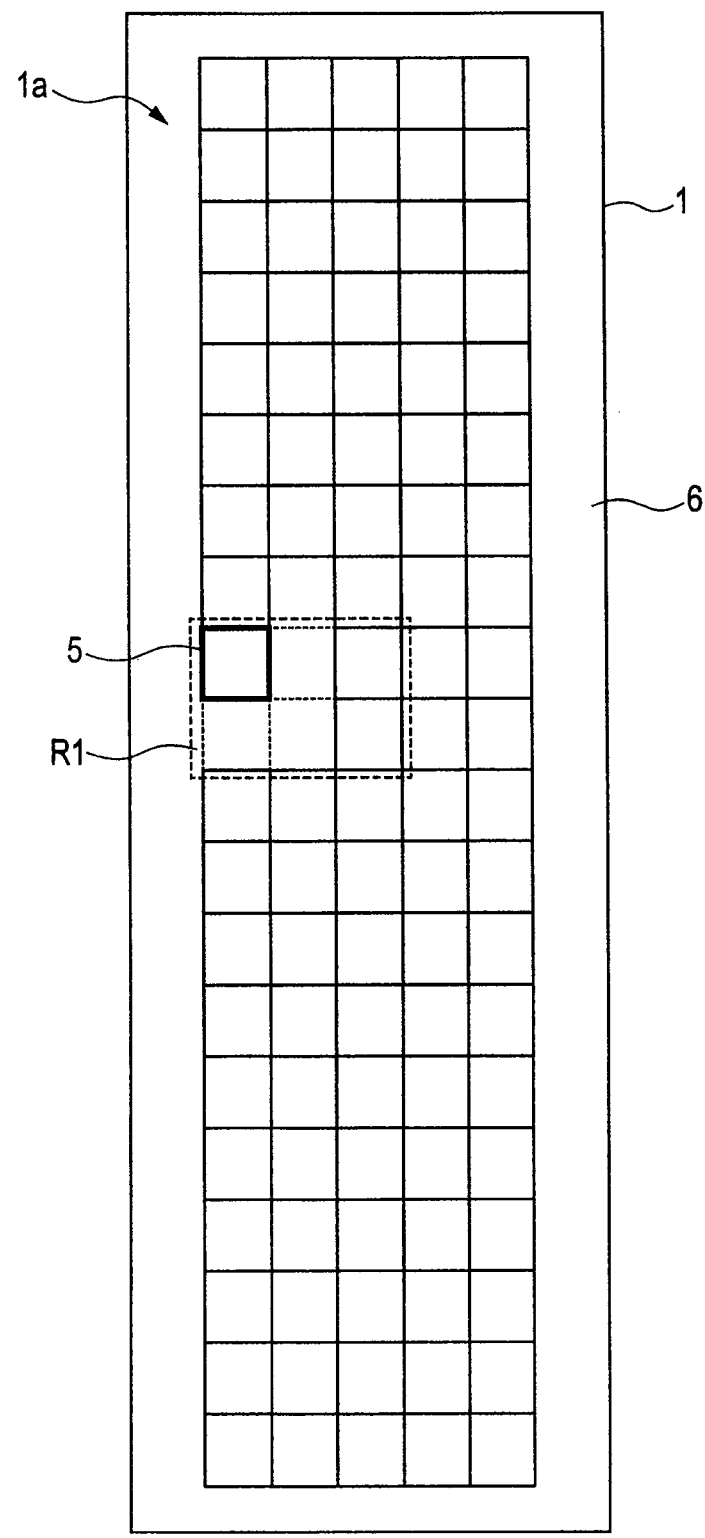
FIG. 1 is an overall top view of a lead frame to be used in a fabrication process in a manufacturing method of a semiconductor device according to a first embodiment of the present application (when the leadframe is inserted)

[Outline of Embodiment] First, typical embodiments of the invention disclosed herein will be outlined.

1. A method of manufacturing a semiconductor device, includes the steps of: (a) providing a lead frame in which a plurality of unit device regions equipped with a die pad, a plurality of leads placed around the die pad, and a frame portion for supporting the die pad and the leads have been arranged in a two-dimensional matrix form; (b) fixing the back surface of a semiconductor chip having on the surface thereof a plurality of electrode pads onto the die pad; (c) coupling the leads and the electrode pads to each other via a wire; (d) after the step (c), forming, in a molding apparatus, a resin sealing body in each of the unit device regions by transfer molding while sandwiching the leadframe between a lower mold die and an upper mold die configuring a mold die set; and (e) releasing, in the molding apparatus, the leadframe encapsulated in the resin sealing body from the lower mold die or the upper mold die. Here, in the step (d), the mold die set is equipped with: (x1) a matrix-state cavity group in which a plurality of cavity columns obtained by linking, in series via a through gate, a plurality of mold cavities provided between the lower mold die and the upper mold die have been placed in a plurality of rows so that they correspond to the unit device regions placed in a two-dimensional matrix form; (x2) a movable ejector pin provided in the lower mold die corresponding to each of the mold cavities belonging to the matrix-state cavity group; and (x3) a plurality of support pillars provided at a plurality of cavity corner portions of the matrix-state cavity group so as not to planarly overlap with the movable ejector pin and to stride over four mold cavities surrounding therewith each of the cavity corner portions.

2. In the method of manufacturing a semiconductor device as described above in 1, the number of the mold cavities configuring the cavity column is 4 or greater but not greater than 10.

3. In the method of manufacturing a semiconductor device as described above in 1 or 2, the movable ejector pins are provided as a pair at a diagonal position, in a planar view, in each of the mold cavities belonging to the matrix-state cavity group.

4. In the method of manufacturing a semiconductor device as described above in any of 1 to 3, the support pillars are provided at every other cavity corner portion so that they are diagonal to each other with an adjacent mold cavity therebetween.

In the method of manufacturing a semiconductor device as described above in any of 1, 3, or 4, the number of mold cavities configuring the cavity line column is 4 or greater but not greater than 6.

6. In the method of manufacturing a semiconductor device as described above in any of 1 to 5, releasing in the step (e) is conducted through the movable ejector pin.

7. In the method of manufacturing a semiconductor device as described above in any of 1 to 6, in the step (d), the mold die is equipped further with: (x4) a pair of fixed ejector pins provided, in a planar view, at a diagonal position in the lower mold die different from the positions of the movable ejector pins, while corresponding to each of the mold cavities belonging to the matrix-state cavity group.

8. In the method of manufacturing a semiconductor device as described above in 7, the fixed ejector pins are each provided adjacent to one of the cavity corner portions at which the support pillars are provided.

9. The method of manufacturing a semiconductor device as described above in any one of 1 to 8, further includes the following step: (f) after the step (e), dicing the leadframe to separate it into the individual unit device regions.

10. In the method of manufacturing a semiconductor device as described above in any one of 1 to 9, in the step (d), the upper mold die and the leadframe are separated from each other with a sheet.

11. A method of manufacturing a semiconductor device includes the steps of: (a) providing a lead frame in which a plurality of unit device regions equipped with a die pad, a plurality of leads placed around the die pad, and a frame portion for supporting the die pad and the leads have been arranged in a two-dimensional matrix form; (b) fixing the back surface of a semiconductor chip having on the surface thereof a plurality of electrode pads onto the die pad; (c) coupling the leads and the electrode pads to each other via a wire; (d) after the step (c), forming, in a molding apparatus, a resin sealing body in each of the unit device regions by transfer molding while sandwiching the leadframe between a lower mold die and an upper mold die configuring a mold die set; and (e) releasing, in the molding apparatus, the leadframe encapsulated in the resin sealing body from the lower mold die or the upper mold die. Here, in the step (d), the mold die set is equipped with: (x1) a matrix-state cavity group in which a plurality of cavity columns obtained by linking, in series via a through gate, a plurality of mold cavities provided between the lower mold die and the upper mold die have been placed in a plurality of rows so that they correspond to the unit device regions placed in a two-dimensional matrix form; and (x2) a plurality of support pillars provided at a plurality of cavity corner portions of the matrix-state cavity group so that they stride over four mold cavities planarly surrounding therewith each of the cavity corner portions.

12. In the method of manufacturing a semiconductor device as described above in 11, the number of the mold cavities configuring the cavity column is 4 or greater but not greater than 10.

13. In the method of manufacturing a semiconductor device as described above in 11 or 12, the support pillars are provided at every other cavity corner portion so that they are diagonal to each other with an adjacent mold cavity therebetween.

14. In the method of manufacturing a semiconductor device as described above in 11 or 13, the number of the mold cavities configuring the cavity column is 4 or greater but not greater than 6.

15. The method of manufacturing a semiconductor device as described above in any one of 11 to 14, further includes the step of: (f) after the step (e), dicing the leadframe to separate it into individual unit device regions.

16. In the method of manufacturing a semiconductor device as described above in any one of 11 to 15, in the step (d), the upper mold die and the leadframe are separated from each other with a sheet.

17. In a method of manufacturing a semiconductor device by filling, while sandwiching a leadframe between mold dies having a matrix-state cavity group in which a plurality of cavity columns obtained by linking a plurality of mold cavities in series via a through gate have been placed in rows, a sealing resin in each of the cavities to seal a semiconductor chip housed in each of the cavities with the resin, a support pillar having a cross-section striding over all the cavities to which a cavity corner portion of the matrix-state cavity group is adjacent is placed at the cavity corner portion when viewed from a plane parallel to the main surface of the leadframe.

Other embodiments of the invention disclosed herein will next be outlined.

1. A manufacturing method of a semiconductor device includes the steps of: (a) providing a lead frame in which a plurality of unit device regions having a die pad, a plurality of leads placed around the die pad, and a frame portion for supporting the die pad and the leads have been arranged in a two-dimensional matrix form; (b) fixing the back surface of a semiconductor chip having, on the surface thereof, a plurality of electrode pads onto the die pad; (c) after the step (b), forming a resin sealing body in each of the unit device regions by transfer molding while sandwiching the lead frame between a lower mold die and an upper mold die configuring a mold die set in a molding apparatus; and (d) releasing, in the molding apparatus, the lead frame encapsulated with the resin sealing body from the lower mold die or the upper mold die. Here, in the step (c), the mold die set has: (x1) a matrix-state cavity group in which a plurality of cavity columns obtained by linking, in series via a through gate, a plurality of mold cavities provided between the lower mold die and the upper mold die have been arranged in a plurality of rows so that they correspond to the unit device regions arranged in a two-dimensional matrix form; (x2) a movable ejector pin provided in the lower mold die so as to correspond to each of the mold cavities belonging to the matrix-state cavity group; and (x3) a plurality of support pillars provided at a plurality of cavity corner portions of the matrix-state cavity group so as to stride over four mold cavities surrounding each of the cavity corner portions without planarly overlapping with the movable ejector pin.

2. In the method of manufacturing a semiconductor device as described above in 1, the number of the mold cavities configuring the cavity column is 4 or greater but not greater than 10.

3. In the method of manufacturing a semiconductor device as described above in 1 or 2, the movable ejector pins are, in a planar view, provided as a pair at a diagonal position in each of the mold cavities belonging to the matrix-state cavity group.

4. In the method of manufacturing a semiconductor device as described above in any one of 1 to 3, the support pillars are provided at every other cavity corner portion so that they are relatively diagonal to each other with an adjacent mold cavity therebetween.

5. In the method of manufacturing a semiconductor device as described above in any one of 1, 3, or 4, the number of the mold cavities configuring the cavity column is 4 or greater but not greater than 6.

6. In the method of manufacturing a semiconductor device as described above in any one of 1 to 5, releasing in the step (d) is performed through the movable ejector pin.

7. In the method of manufacturing a semiconductor device as described above in any one of 1 to 6, in the step (c), the mold die set further has: (x4) a pair of fixed ejector pins provided, corresponding to each of the mold cavities belonging to the matrix-state cavity group, at a diagonal position, in a planar view, different from that of the movable ejector pins in each of the mold cavities.

8. In the method of manufacturing a semiconductor device as described above in 7, the pair of fixed ejector pins is provided in the vicinity of one of the cavity corner portions at which the support pillars have been provided.

9. The method of manufacturing a semiconductor device as described above in any one of 1 to 8, further includes the step of: (e) after the step (d), dicing the leadframe to separate it into unit device regions.

10. In the method of manufacturing a semiconductor device as described above in any of 1 to 9, the upper mold die and the lead frame in the step (c) are separated by a sheet.

11. A method of manufacturing a semiconductor device, includes the steps of: (a) providing a lead frame in which a plurality of unit device regions having a die pad, a plurality of leads placed around the die pad, and a frame portion for supporting the die pad and the leads have been arranged in a two-dimensional matrix form; (b) fixing the back surface of a semiconductor chip having on the surface thereof a plurality of electrode pads onto the die pad; (c) after the step (b), in a molding apparatus, forming a resin sealing body in each unit device region by transfer molding while sandwiching the lead frame between a lower mold die and an upper mold die configuring a mold die set; and (d) in the molding apparatus, releasing the lead frame encapsulated with the resin sealing body from the lower mold die or the upper mold die. Here, the mold die set in the step (c) has: (x1) a matrix-state cavity group in which a plurality of cavity columns obtained by linking, in series via a through gate, a plurality of mold cavities provided between the lower mold die and the upper mold die have been placed in rows so as to correspond to the unit device regions arranged in a two-dimensional matrix form; and (x2) a plurality of support pillars provided at a plurality of cavity corner portions of the matrix-state cavity group so as to stride over four mold cavities planarly surrounding therewith each of the cavity corner portions.

12. In the method of manufacturing a semiconductor device as described above in 11, wherein the number of the mold cavities configuring the cavity column is 4 or greater but not greater than 10.

13. In the method of manufacturing a semiconductor device as described above in 11 or 12, the support pillars are provided at every other cavity corner portion so that they are relatively diagonal to each other with the adjacent mold cavity therebetween.

14. In the method of manufacturing a semiconductor device as described above in any one of 11 or 13, the number of the mold cavities configuring the cavity column is 4 or greater but not greater than 6.

15. The method of manufacturing a semiconductor device as described above in any one of 11 to 14, further includes the step of: (e) after the step (d), dicing the lead frame to separate it into unit device regions.

16. In the method of manufacturing a semiconductor device as described above in any one of 11 to 15, in the step (c), the upper mold die and the lead frame are separated from each other with a sheet.

[Explanation of Description Manner, Basic Terms, and Usage in the Present Application]

1. In the present application, a description in the embodiments will be made after divided in plural sections if necessary for convenience's sake. These plural sections are not independent each other, but they may each be a part of a single example or one of them may be a partial detail of the other or a modification example of a part or whole of the other one unless otherwise specifically indicated. In principle, a description on a portion similar to that described before is not repeated. Moreover, when a reference is made to constituent elements in the embodiments, they are not essential unless otherwise specifically indicated, limited to the number theoretically, or principally apparent from the context that it is not.

2. Similarly, with regard to any material, any composition or the like in the description of embodiments, the term "X made of A" or the like does not exclude X having, as a main configuring component thereof, an element other than A unless otherwise specifically indicated or principally apparent from the context it is not. For example, the term "X made of A" means that "X has, as a main component thereof, A". It is needless to say that, for example, the term "silicon member" is not limited to a member made of pure silicon but also a member containing a SiGe alloy or another multi-element alloy having silicon as a main component, an additive, and the like. Similarly, the term "gold plate", "copper layer", "nickel plate", or the like includes not only a pure one but also a member containing gold, copper, nickel, or the like as a main component, respectively, unless otherwise specifically indicated.

3. Preferred examples of the shape, position, attribute, and the like will be shown, however, it is needless to say that they are not strictly limited to the preferred examples unless otherwise specifically indicated or apparent from the context that it is not. For example, the term "rectangle" or "almost rectangle" includes not only a complete square or a complete rectangle but also a shape similar thereto. For example, a square having four chamfered or rounded corners is a rectangle. With a square as an example, when an area removed from an ideal square by chamfering or the like is less than 15% of the area of the ideal square, the deformed square is a rectangle.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor device (which may be a semiconductor integrated circuit device or an electronic device) is to be formed. It is however needless to say that it embraces composite wafers of an insulating substrate with a semiconductor layer such as SOI wafer and epitaxial wafer.

6. The term "semiconductor chip" usually means a die or the like having a semiconductor device or semiconductor integrated circuit formed thereover after a wafer dividing step (blade dicing, laser dicing, or pelletizing step). A description will be made mainly with a silicon chip as an example, but it may be a GaAs chip or another device chip.

7. In transfer molding referred to mainly in the present application, a resin sealing material is formed by melting, transferring (moving), injecting (filling), and curing (compression molding does not include any of melting, transferring, and injecting in a literal sense) a resin by making use of various space regions formed when an upper mold die and a lower mold die of a mold die set are closed. When this procedure is described, a reference number is sometimes used in common between the above-described various space regions related to a mold die such as a pot portion housing a resin tablet therein, a cull portion provided so as to face this pot portion, a runner portion for linking the cull portion to the cavity portion, and a gate formed in a boundary region between the runner portion and the cavity portion and portions of a resin sealing body (including a region on a wiring substrate) corresponding thereto. Incidentally, in the sealing technology, not a metal portion of the mold die but a void portion thereof has a meaning so that in some drawings, only a filling member is sometimes indicated clearly while omitting the metal portion of the mold die.

8. In the present application, there is a possibility of confusion in a vertical positional relationship occurring when a leadframe is turned upside down upon sealing. With regards to the leadframe and a material attached or fixed thereto, the term "upper surface" means a surface on which a semiconductor chip has been mounted or is to be mounted with the leadframe as a standard unless otherwise specifically indicated or apparent from the context that it is not. Accordingly, with regards to the mold die or members related thereto, the term "upper surface" means, as usual, a direction contrary to the direction of gravity.

[Details of Embodiment] Embodiments will next be described more specifically. In all the drawings, the same or like members will be identified by the same or like symbols or reference numbers and overlapping descriptions will be omitted in principle.

In the accompanying drawings, hatching or the like is sometimes omitted even from the cross-section when it makes the drawing cumbersome and complicated or when a member can be discriminated clearly from a void. In this context, when apparent from the explanation or the like, a contour of the background is sometimes omitted even if a hole is planarly closed. Furthermore, hatching may be given to a portion other than a cross-section in order to clearly show that it is not a void.

1. Description on the Outline of a Fabrication Process and Package Structure in the Manufacturing Method of a Semiconductor Device According to the First Embodiment of the Present Application (Mainly from FIG. 1 to FIG. 18)

In the following examples, a detailed description will be made with a QFN type device as an example. It is needless to say that it can also be applied to QFP (quad flat package) or a plastic package of another type.

Figure 2:
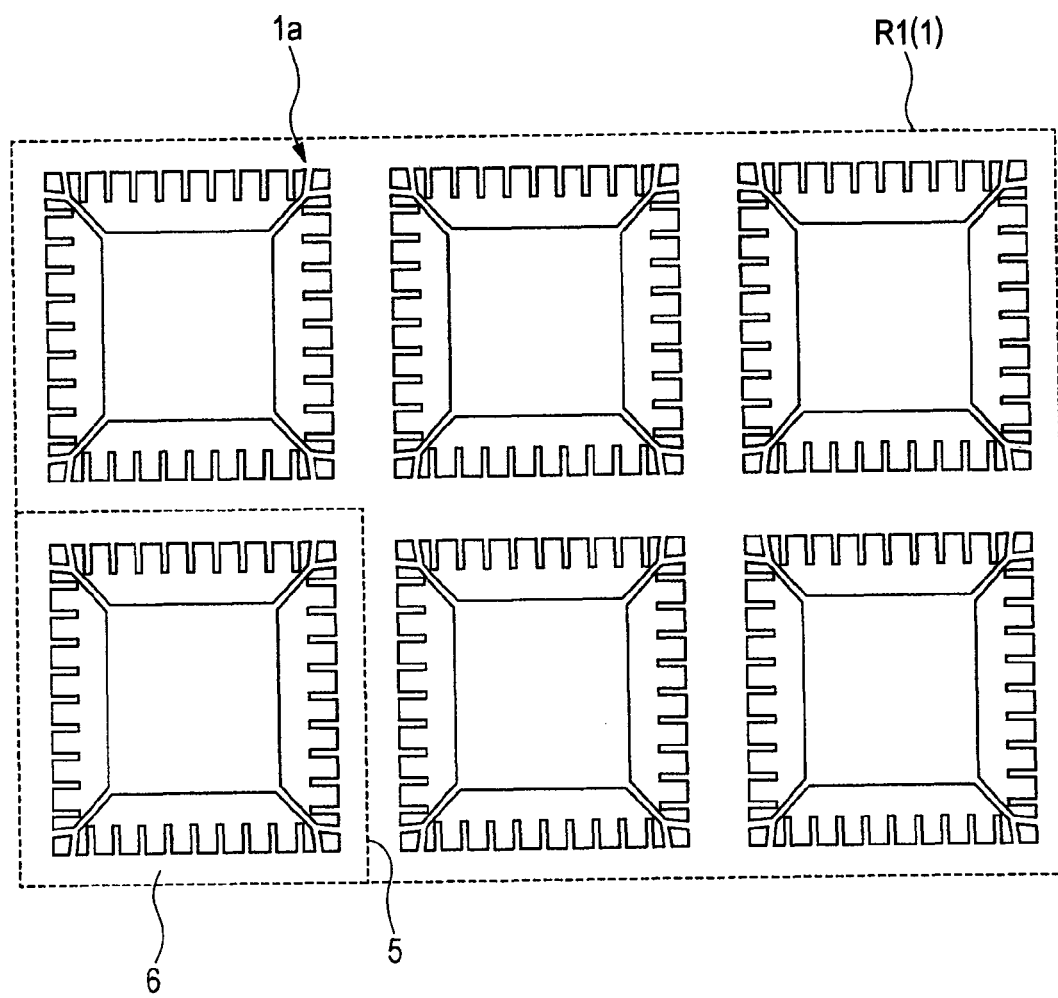
FIG. 2 is a fragmentary enlarged top view of the leadframe corresponding to a leadframe cutout region R1 of FIG. 1 (when the leadframe is inserted)
Figure 3:
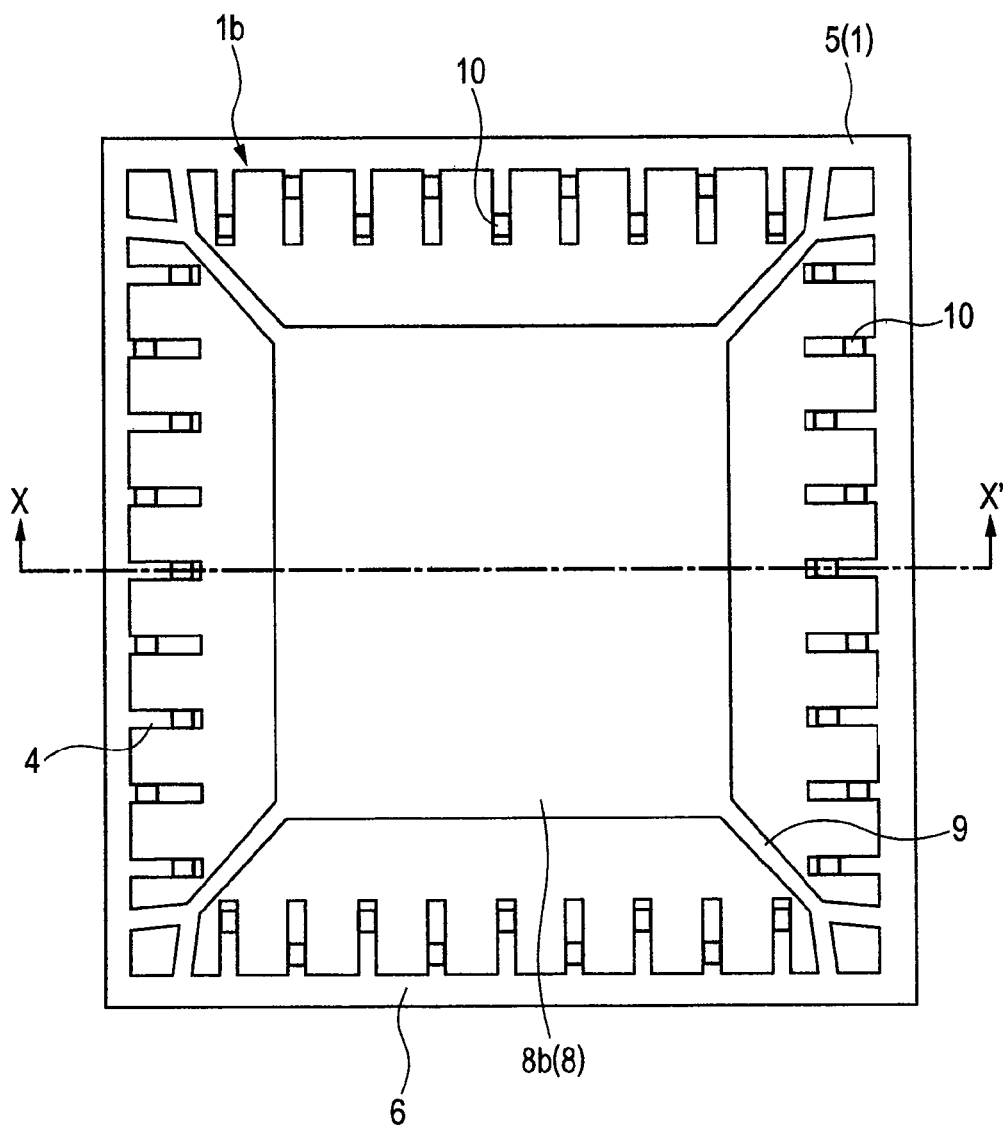
FIG. 3 is an overall back surface view of a unit device region 5 of FIG. 2 (when the leadframe is inserted)
Figure 4:
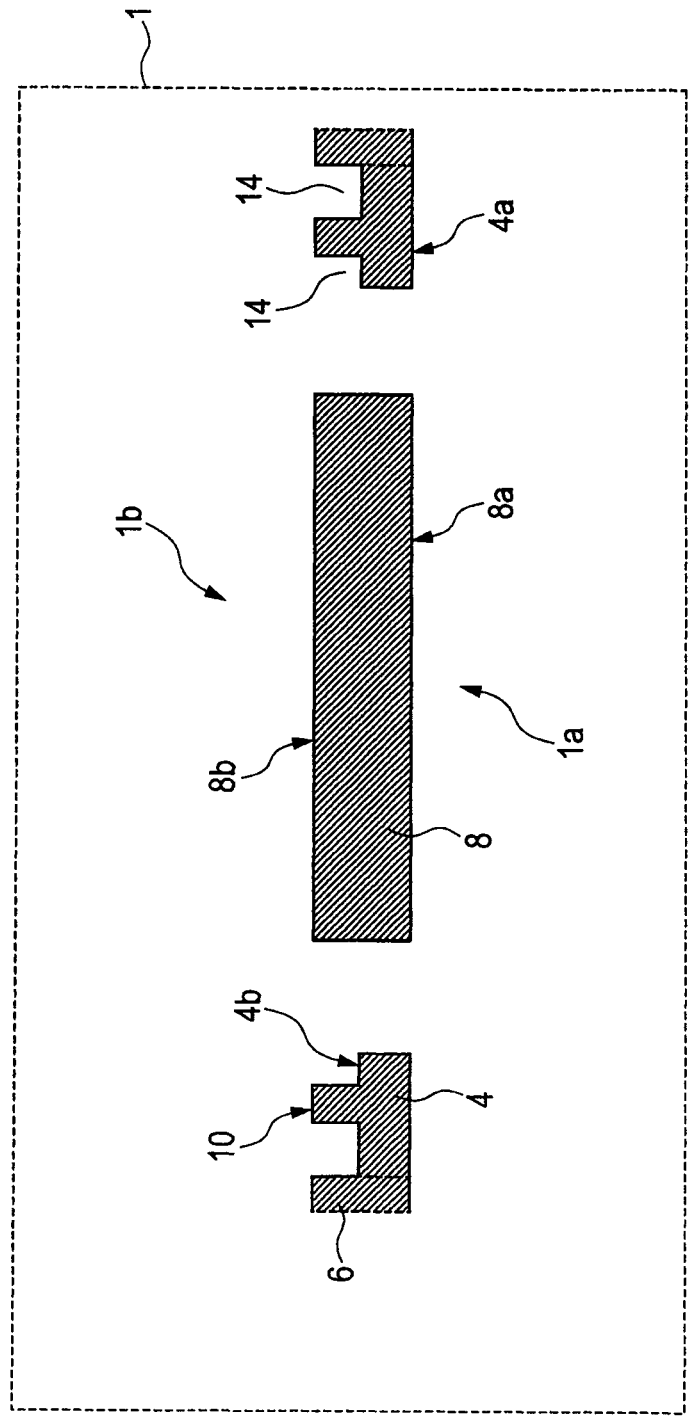
FIG. 4 is a schematic cross-sectional view of the leadframe corresponding to the X-X' cross-section of FIG. 3 (when the leadframe is inserted)
Figure 5:
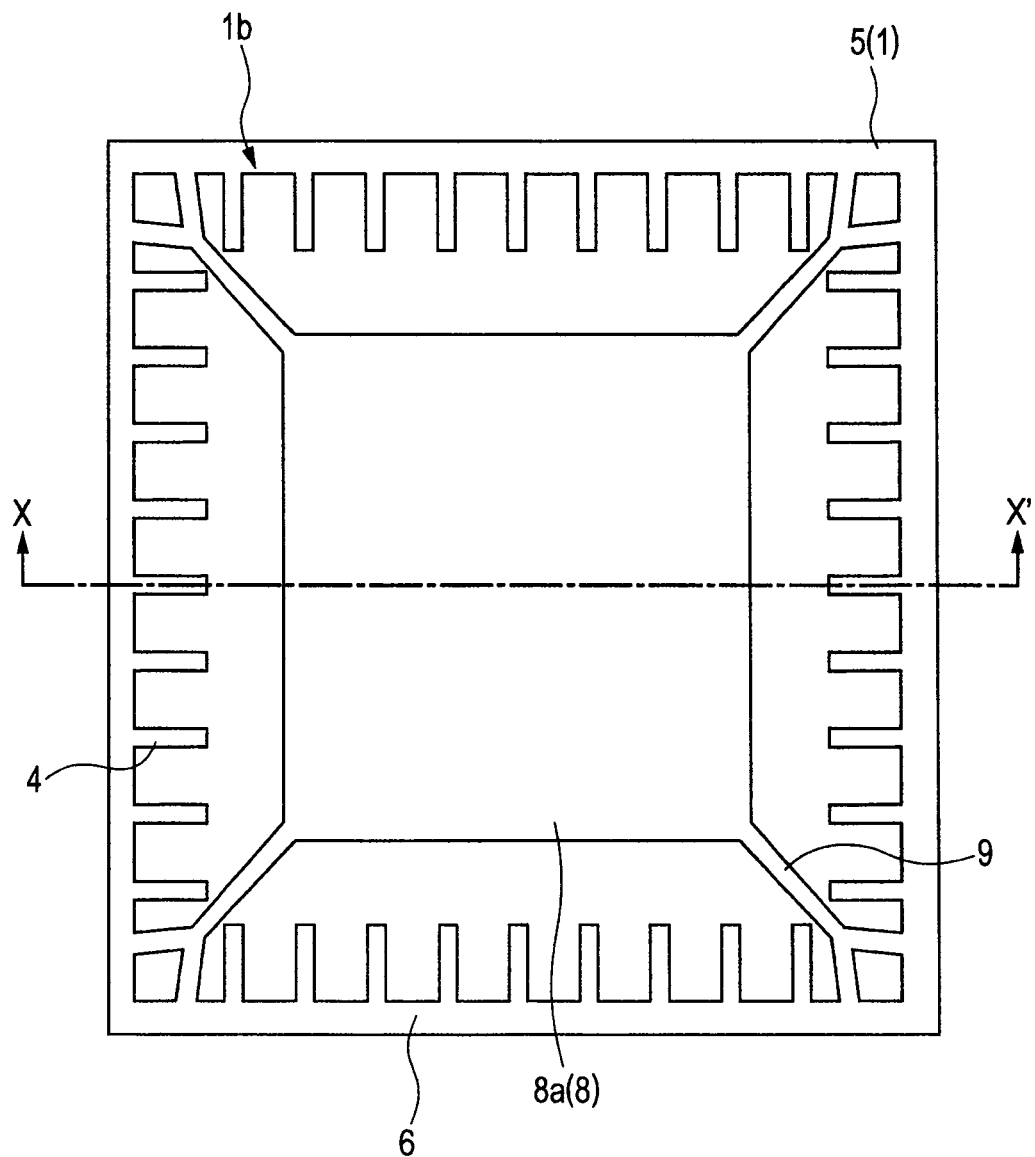
FIG. 5 is an overall surface view of the unit device region 5 of FIG. 2 (when the leadframe is inserted)
Figure 6:
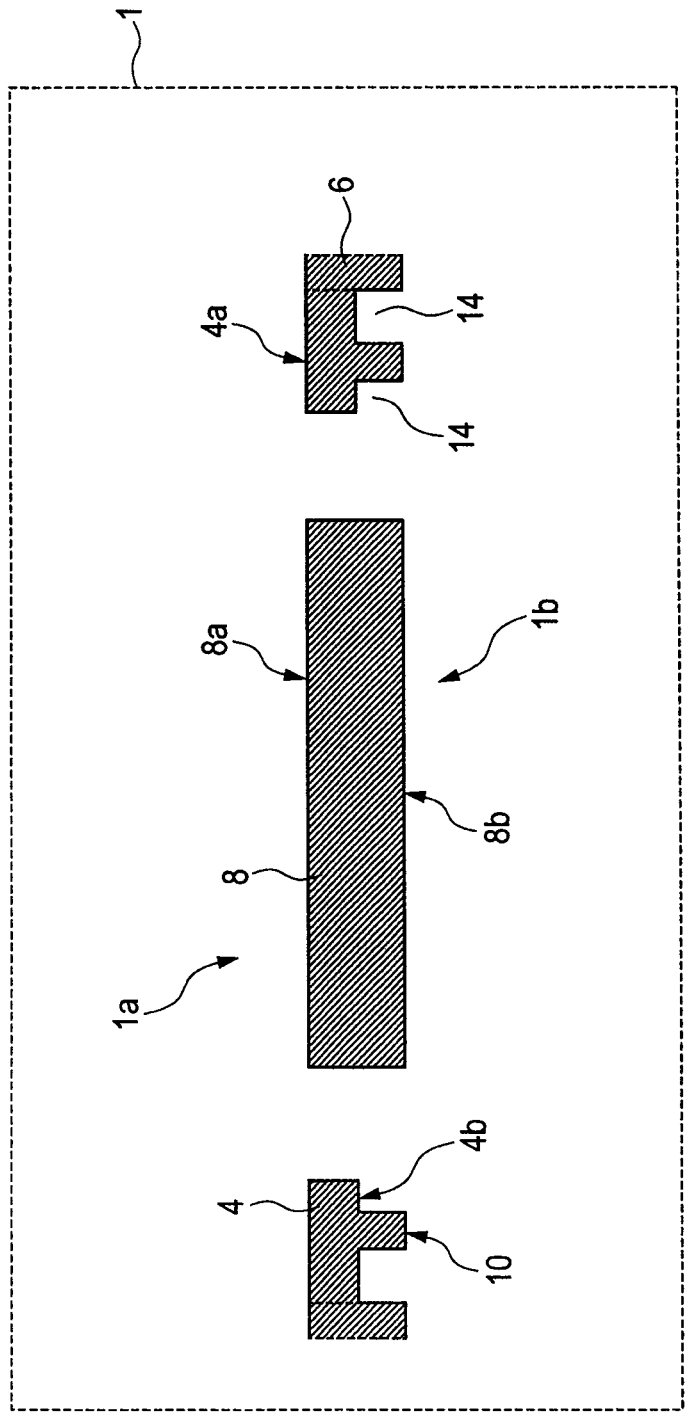
FIG. 6 is a schematic cross-sectional view of the leadframe corresponding to the X-X' cross-section of FIG. 5 (when the leadframe is inserted)
Figure 7:
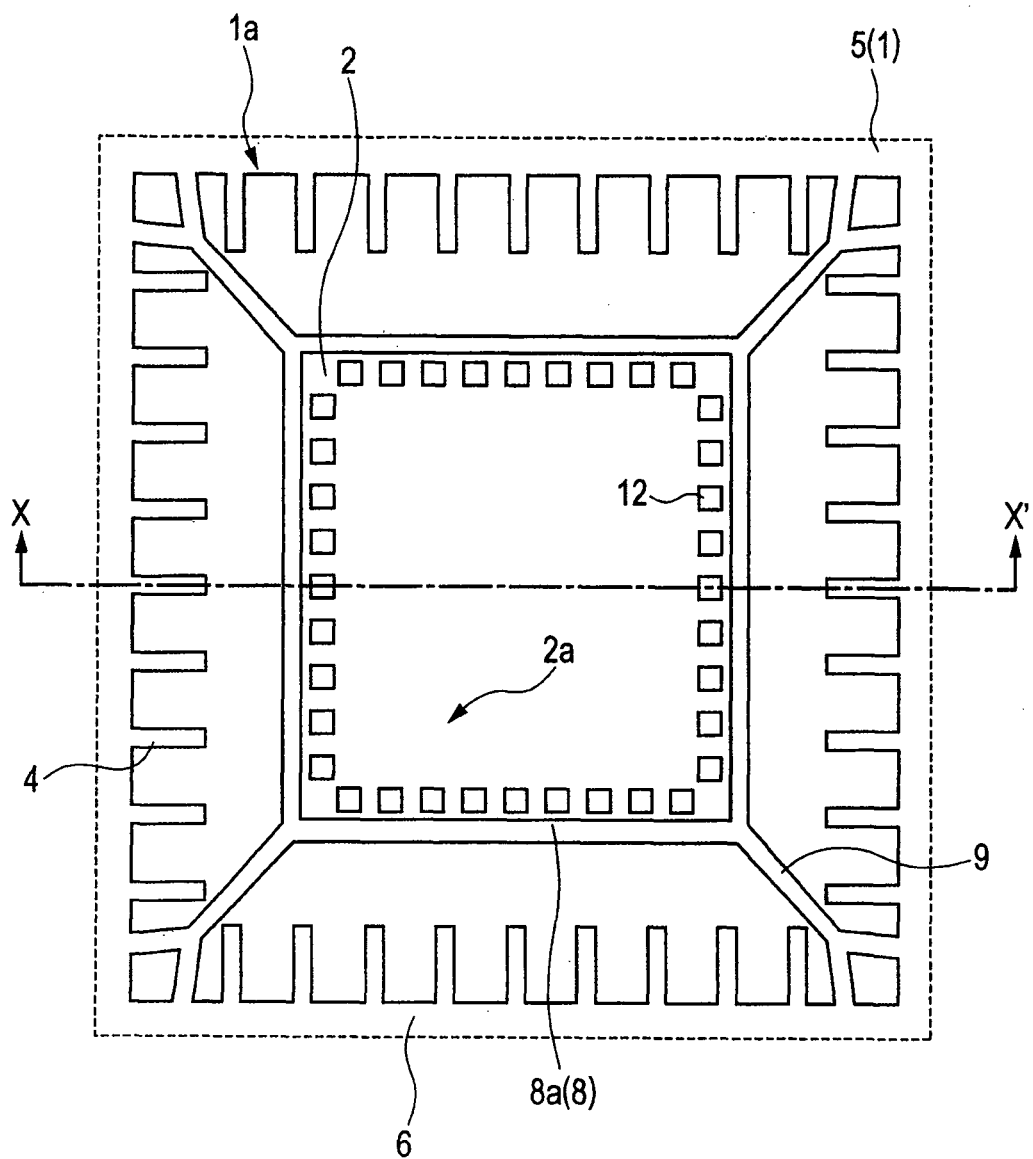
FIG. 7 is an overall surface view of the unit device region 5 of FIG. 2 (when die bonding is completed)
Figure 8:
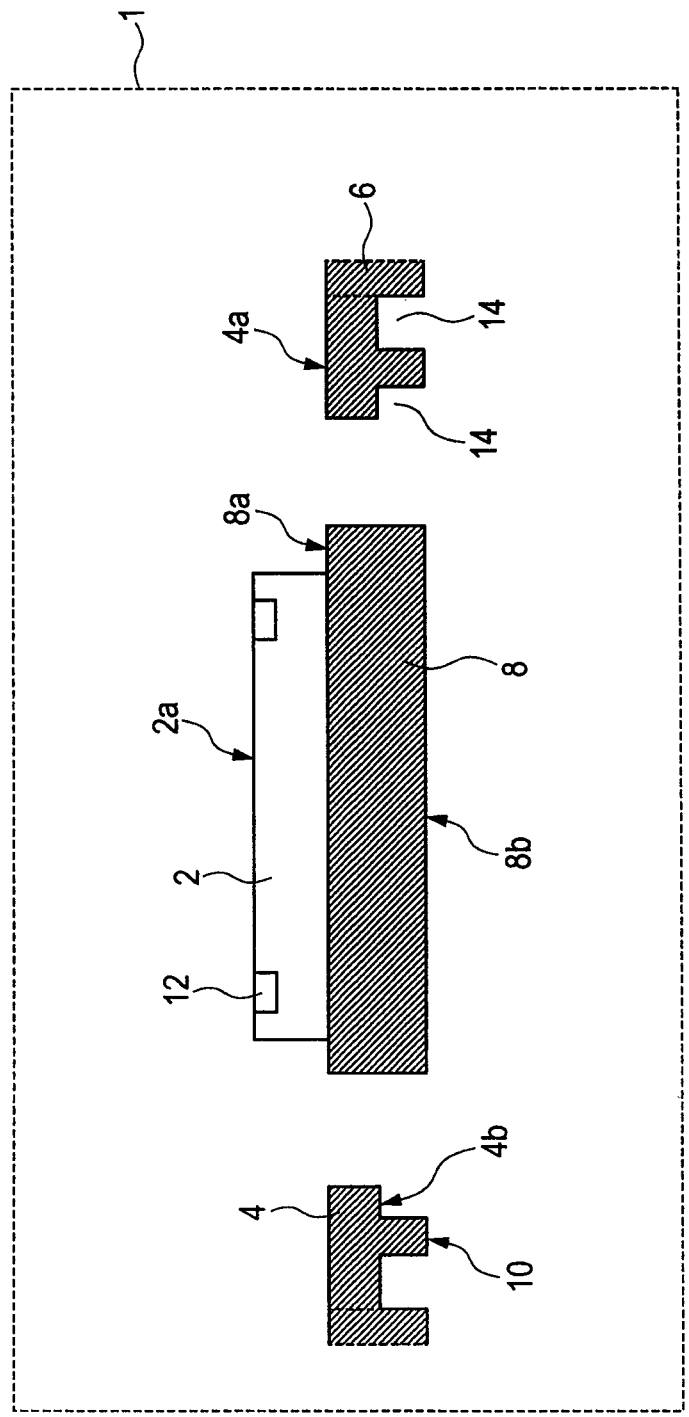
FIG. 8 is a schematic cross-sectional view of the leadframe corresponding to the X-X' cross-section of FIG. 7 (when die bonding is completed)
Figure 9:
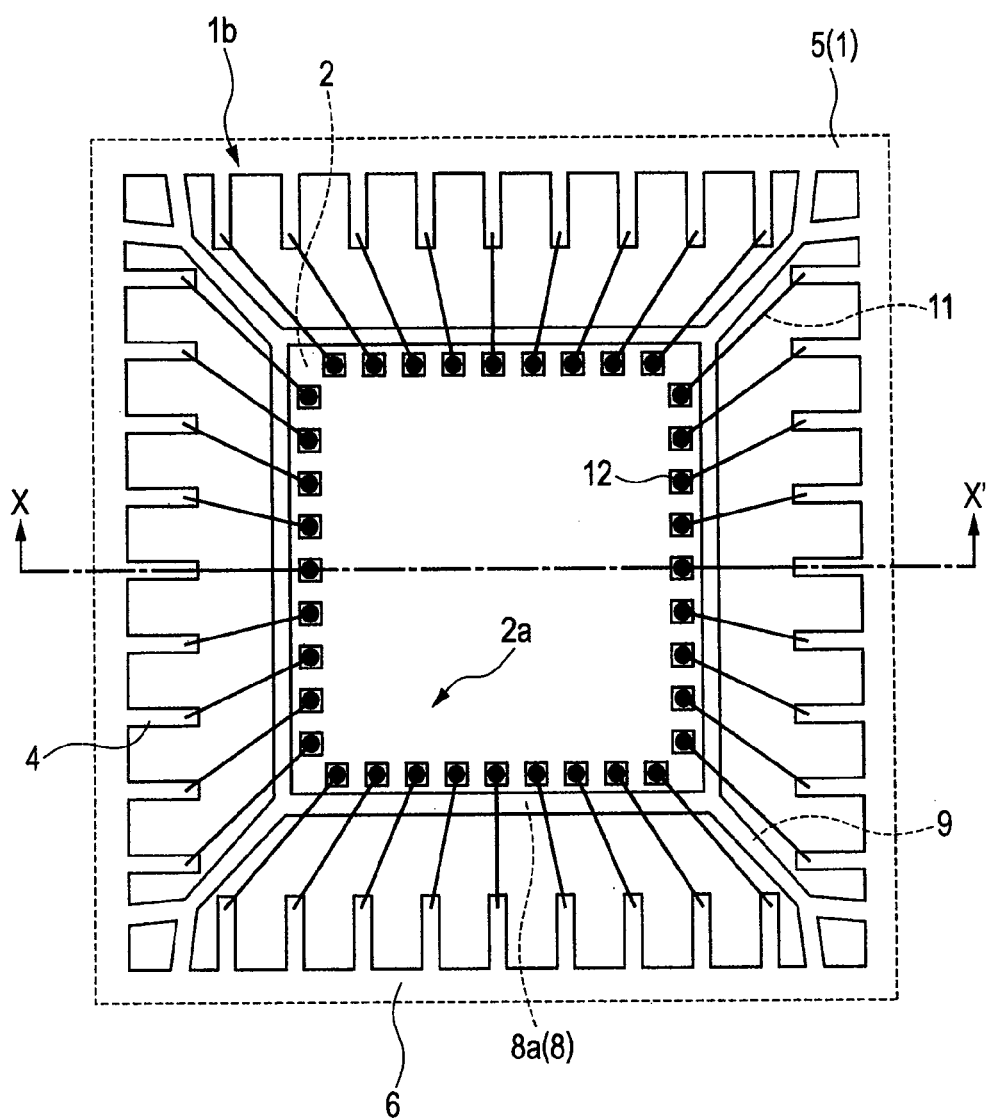
FIG. 9 is an overall surface view of the unit device region 5 of FIG. 2 (when wire bonding is completed)
Figure 10:
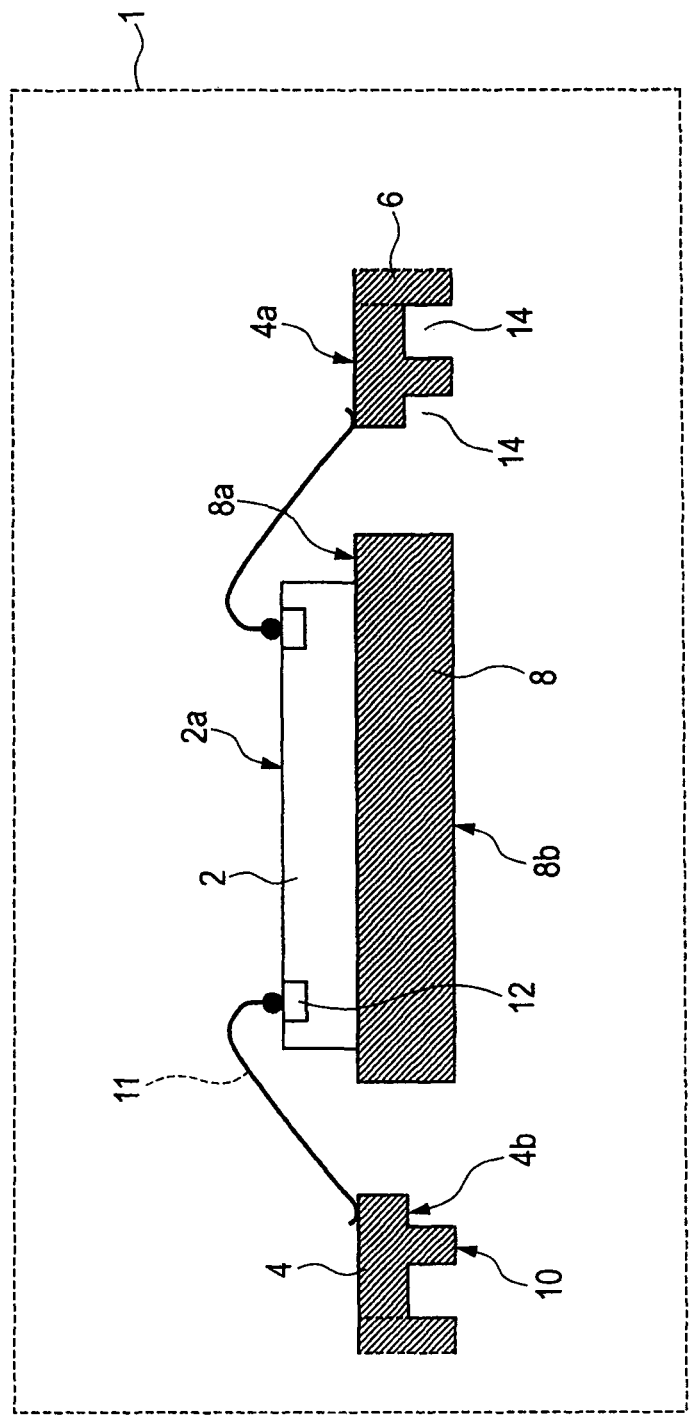
FIG. 10 is a schematic cross-sectional view of the leadframe corresponding to the X-X' cross-section of FIG. 9 (when wire bonding is completed)
Figure 11:
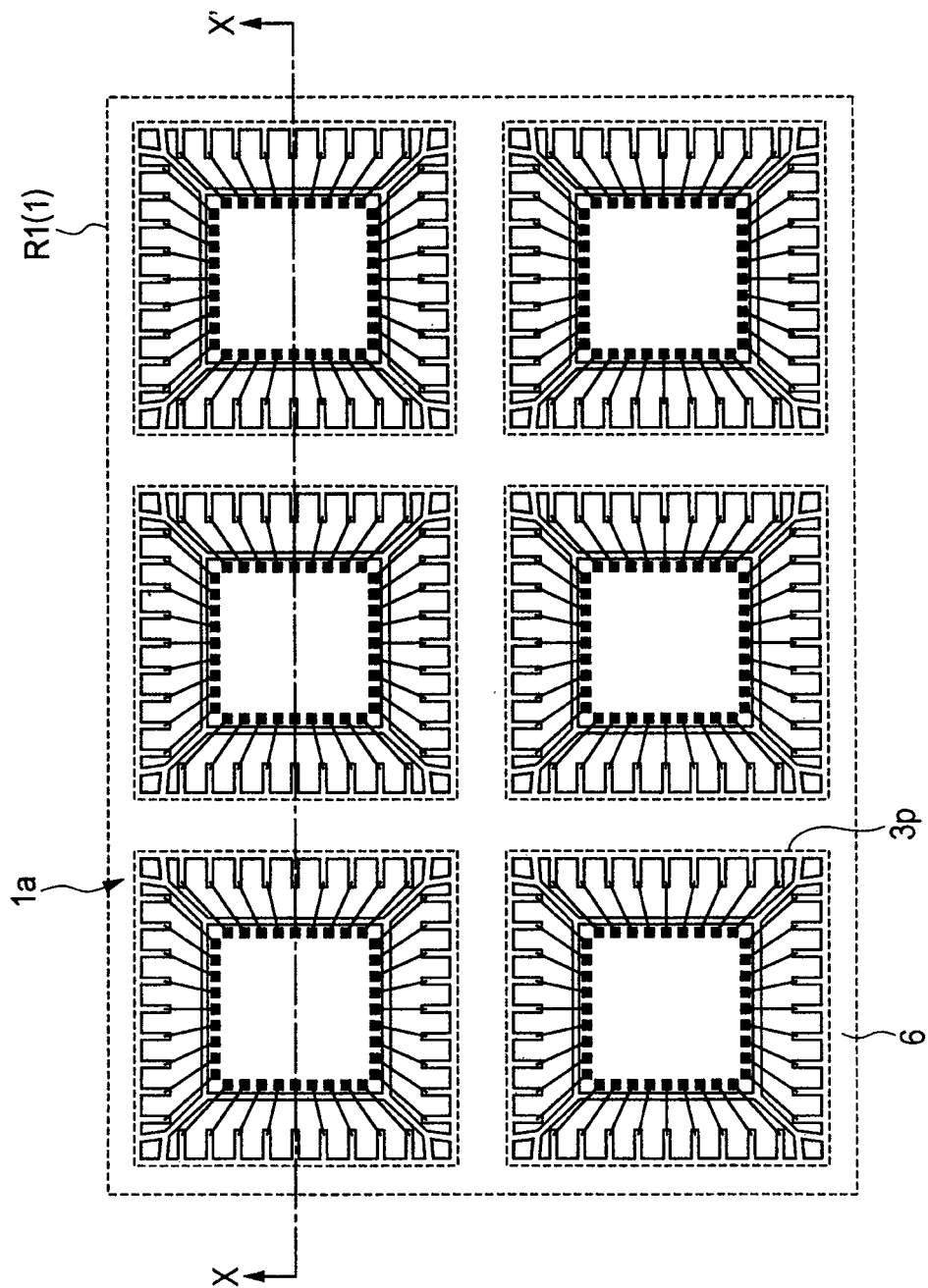
FIG. 11 is a fragmentary enlarged top view of the leadframe corresponding to the leadframe cutout region R1 of FIG. 1 (when transfer molding is completed; only the outer periphery of a sealing body is indicated with a broken line)
Figure 12:
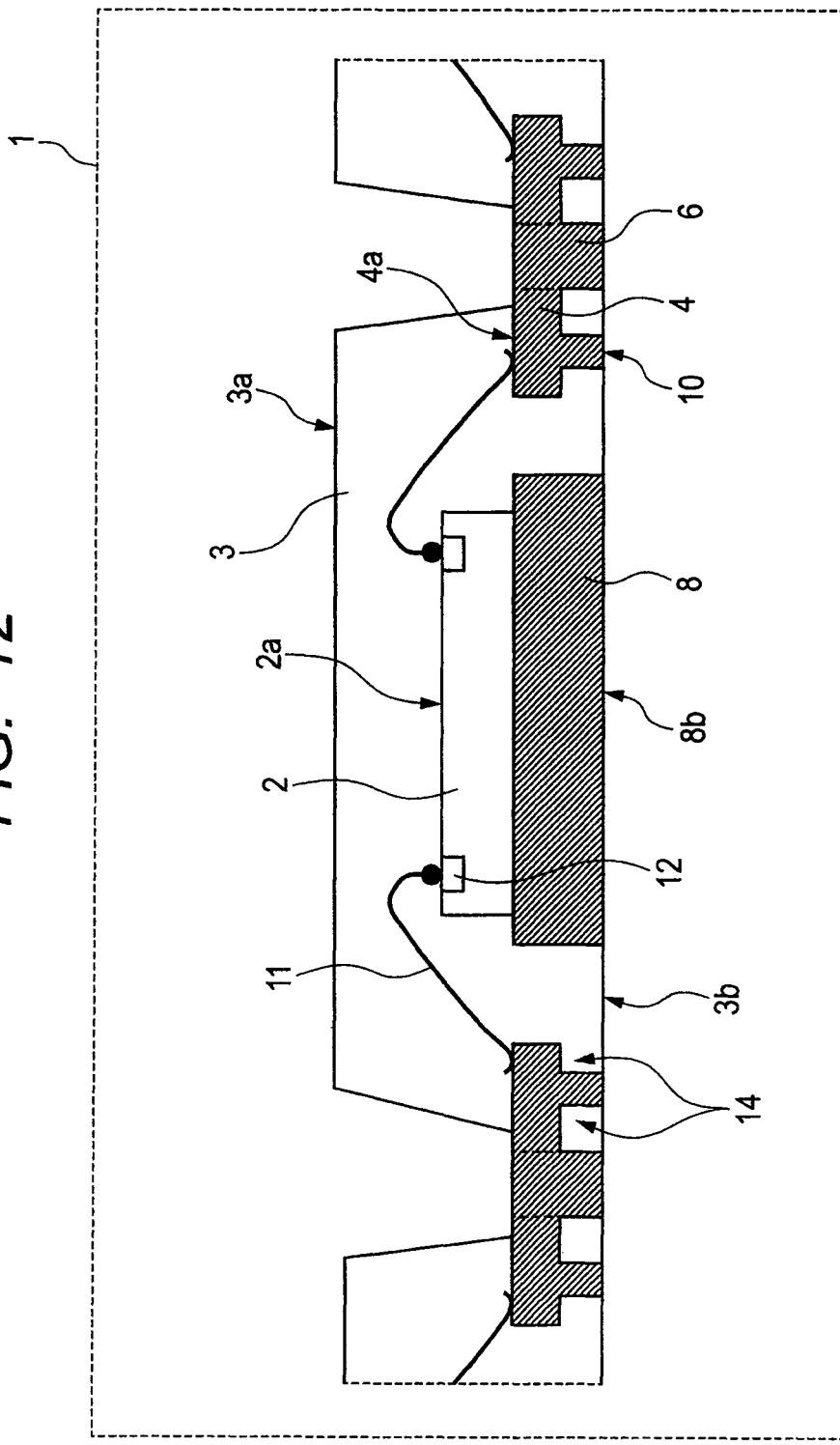
FIG. 12 is a fragmentary schematic cross-sectional view of the leadframe corresponding to the X-X' cross-section of FIG. 11 (when transfer molding is completed)
Figure 13:
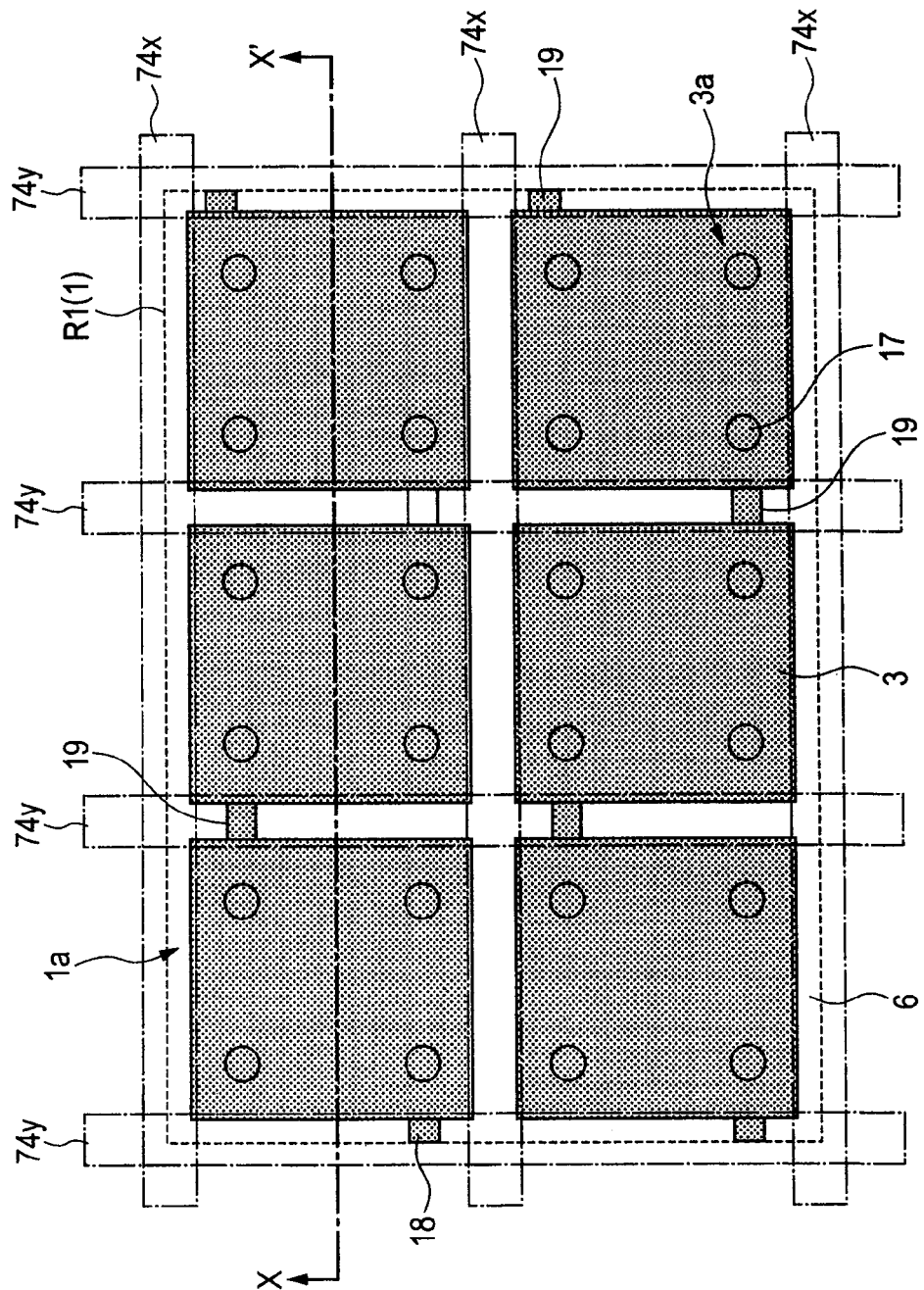
FIG. 13 is a fragmentary enlarged top view of the leadframe corresponding to the leadframe cutout region R1 of FIG. 1 (package dicing step)
Figure 14:
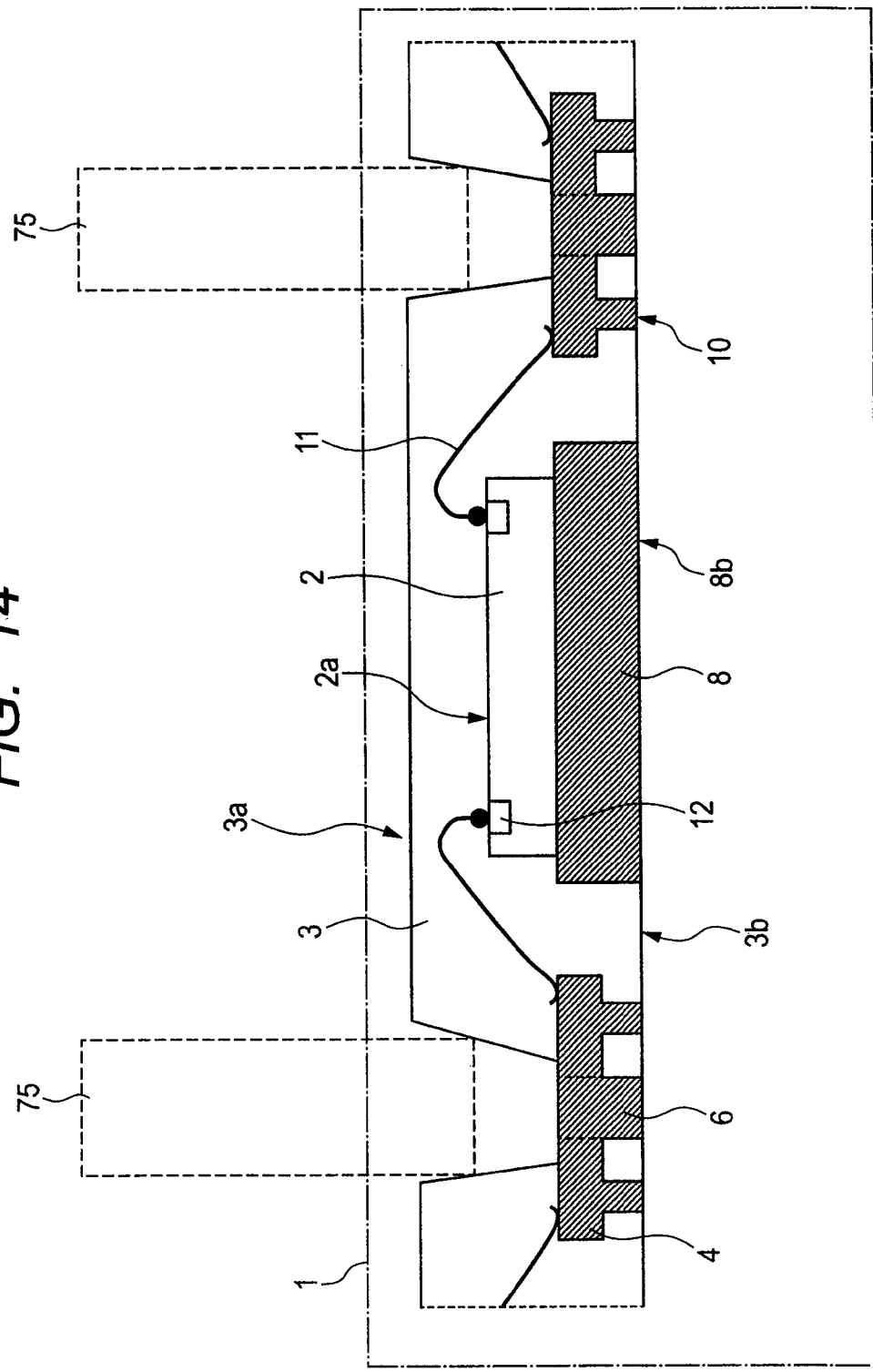
FIG. 14 is a fragmentary schematic cross-sectional view of the leadframe corresponding to the X-X' cross-section of FIG. 13 (when transfer molding is completed)
Figure 15:
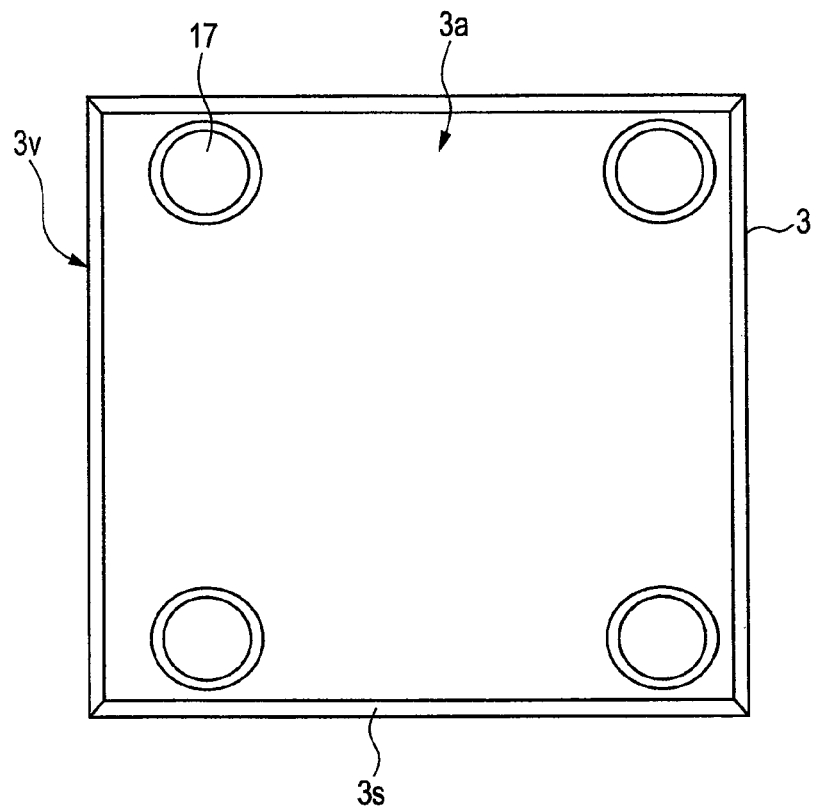
FIG. 15 is a top view of a package (resin sealing body) after separation into individual packages.
Figure 16:
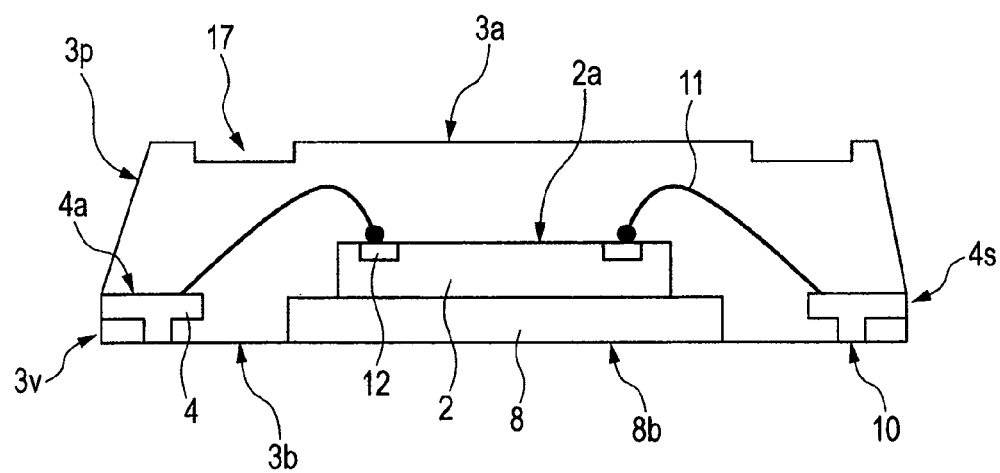
FIG. 16 is a schematic cross-sectional view for describing the structure (structure of an ejector pin trace and the like) of the package (resin sealing body) of FIG. 15.
Figure 17:
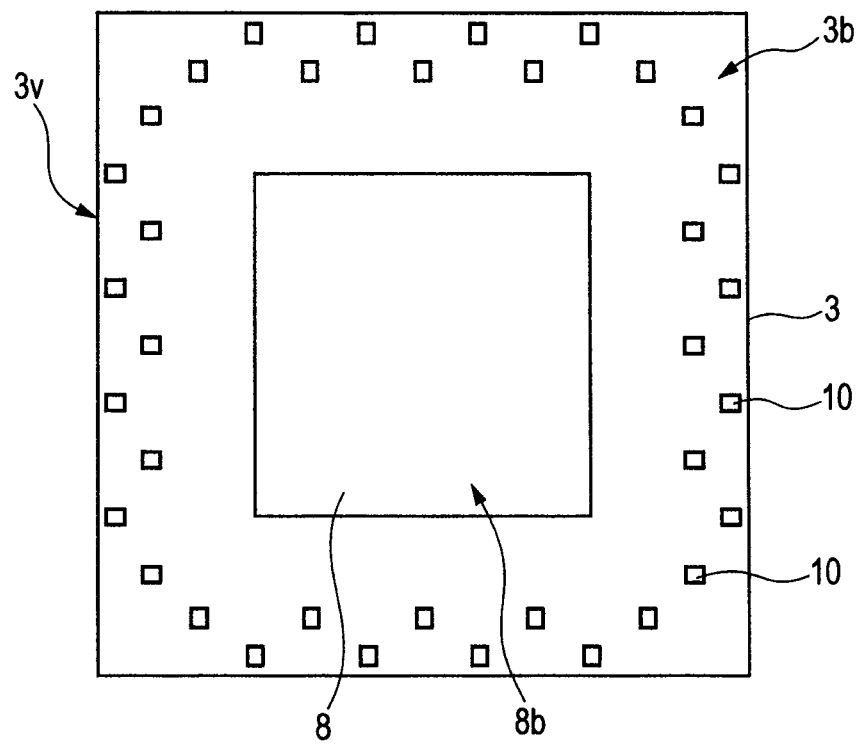
FIG. 17 is a back surface view of the package (resin sealing body) of FIG. 15.
Figure 18:
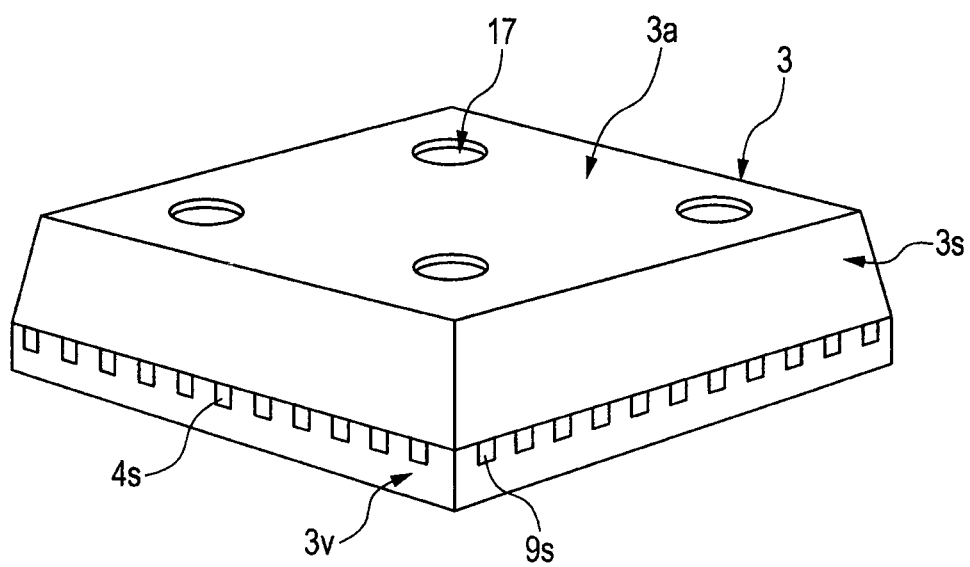
FIG. 18 is a perspective view of the package (resin sealing body) of FIG. 15.

FIG. 1 is an overall top view of a lead frame to be used in a fabrication process in a manufacturing method of a semiconductor device according to a first embodiment of the present application (when the leadframe is inserted). FIG. 2 is a fragmentary enlarged top view of the leadframe corresponding to a leadframe cutout region R1 of FIG. 1 (when the leadframe is inserted). FIG. 3 is an overall back surface view of a unit device region 5 of FIG. 2 (when the leadframe is inserted). FIG. 4 is a schematic cross-sectional view of the leadframe corresponding to the X-X' cross-section of FIG. 3 (when the leadframe is inserted). FIG. 5 is an overall surface view of the unit device region 5 of FIG. 2 (when the leadframe is inserted). FIG. 6 is a schematic cross-sectional view of the leadframe corresponding to the X-X' cross-section of FIG. 5 (when the leadframe is inserted). FIG. 7 is an overall surface view of the unit device region 5 of FIG. 2 (when die bonding is completed). FIG. 8 is a schematic cross-sectional view of the leadframe corresponding to the X-X' cross-section of FIG. 7 (when die bonding is completed). FIG. 9 is an overall surface view of the unit device region 5 of FIG. 2 (when wire bonding is completed). FIG. 10 is a schematic cross-sectional view of the leadframe corresponding to the X-X' cross-section of FIG. 9 (when wire bonding is completed). FIG. 11 is a fragmentary enlarged top view of the leadframe corresponding to the leadframe cutout region R1 of FIG. 1 (when transfer molding is completed; only the outer periphery of a sealing body is indicated with a broken line). FIG. 12 is a fragmentary schematic cross-sectional view of the leadframe corresponding to the X-X' cross-section of FIG. 11 (when transfer molding is completed). FIG. 13 is a fragmentary enlarged top view of the leadframe corresponding to the leadframe cutout region R1 of FIG. 1 (package dicing step). FIG. 14 is a fragmentary schematic cross-sectional view of the leadframe corresponding to the X-X' cross-section of FIG. 13 (when transfer molding is completed). FIG. 15 is a top view of a package (resin sealing body) after separation into individual packages. FIG. 16 is a schematic cross-sectional view for describing the structure (structure of an ejector pin trace and the like) of the package (resin sealing body) of FIG. 15. FIG. 17 is a back surface view of the package (resin sealing body) of FIG. 15. FIG. 18 is a perspective view of the package (resin sealing body) of FIG. 15. Based on these drawings, the outline of the fabrication process and the package structure in the manufacturing method of a semiconductor device according to the first embodiment of the present application will next be described.

First, a leadframe 1 made of a metal (for example, a metal having copper as a main component) and supporting, at a frame portion 6 thereof, unit device regions 5 in a two-dimensional matrix form as illustrated in FIG. 1 is prepared. An enlarged view of a cutout region R1 of a plurality of the unit device regions 5 on the surface 1a of the leadframe 1 on which a chip is to be mounted is shown in FIG. 2.

An enlarged view of the back surface (back surface 1b of the leadframe) of one of the unit device regions 5 shown in FIG. 1 or 2 is shown in FIG. 3. As illustrated in FIG. 3, the back surface of the unit device region has, at the center thereof, a rectangular die pad 8 (die pad 8b) on which a semiconductor chip 2 is to be mounted and this die pad 8 is linked to the frame portion 6 with a die pad support bar 9 (die pad suspending lead) at the four corner portions. From each side of the frame portion 6, a plurality of leads 4 extend toward the die pad support bar 9. The leads 4 each has a terminal portion 10 so that the terminal portion of one of the leads is staggered from that of a lead adjacent thereto.

The X-X' cross-section of FIG. 3 is shown in FIG. 4. As illustrated in FIG. 4, the surface 8a of the die pad 8 is a surface on which the semiconductor chip 2 is to be mounted and the back surface 4b of the lead 4 has, different from the surface 4a, a half etch portion 14. The surface corresponding to FIG. 3 is shown in FIG. 5, while the X-X' cross-section of FIG. 5 corresponding to FIG. 4 is shown in FIG. 6.

As illustrated in FIG. 7, die bonding is then performed to fix, for example, the back surface 2b of the semiconductor chip 2 and the surface 8a of the die pad 8 via an adhesive layer. As the adhesive layer, a die bonding film and the like as well as conductive pastes such as silver paste and gold paste are preferred. The semiconductor chip 2 has, on the surface-side main surface 2a (a surface, a surface on which an electrode pad is to be formed) thereof, a plurality of bonding pads 12 (electrode pads).

The X-X' cross-section of FIG. 7 is shown in FIG. 8. As illustrated in FIG. 8, the surface-side surface 4a of the lead 4 is relatively flat in this example, but the back surface 4b has relatively unevenness because it has been subjected to half etch treatment.

As illustrated in FIG. 9, wire bonding is then performed to interconnect a plurality of leads 4 and a plurality of bonding pads 12 corresponding thereto to each other, for example, with a gold bonding wire 11. The X-X' cross-section of FIG. 9 is shown in FIG. 10. The wire bonding is usually performed through thermosonic system ball & wedge bonding by using, for example, a bonding capillary, while using a gold bonding wire (a metal wire having gold as a main component) or the like and heating the lead 4 to about 230° C.

Then, as illustrated in FIG. 11, each of the unit device regions 5 is sealed (for example, transfer molded) with a sealing resin to form a sealing body (FIG. 12) (transfer molding is usually performed while heating a mold die to approximately 175° C.) In this drawing, an outer periphery 3p of the resin sealing body corresponding to each of the unit device regions 5 is indicated with a broken line. The X-X' cross-section of FIG. 11 is shown in FIG. 12. As illustrated in FIG. 12, the top surface 3a (marking surface) of the resin sealing body 3 is almost composed solely of a resin, while the back surface 1b of the leadframe 1, that is, a terminal portion 10 which is a part of the lead 4, the back surface 8b of the die pad 8, and the like are exposed from the bottom surface 3b (terminal surface) of the resin sealing body 3.

After sealing, batch curing is performed for about several hours at a temperature of approximately 175° C. Then, treatments such as plating of the leads are performed, followed by a separation step into individual devices.

As illustrated in FIG. 13, package dicing is then performed to separate the leadframe 1 (that is, a composite of the leadframe, the sealing body, and the like) into individual packages (devices). The resin sealing body 3 after completion of resin sealing has, on the top surface 3a thereof, a plurality of ejector pin traces 17. Two adjacent resin sealing bodies 3 have therebetween a through gate resin 19. In addition, the resin sealing body 3 has therearound an injection gate resin 18 and the like. The X-X' cross-section of FIG. 13 is shown in FIG. 14. Package dicing is performed, for example, by cutting a portion of the leadframe 1 and the resin sealing body 3 along the dicing lines 74x and 74y (dicing regions) by using, for example, a dicing blade 75 (rotary blade).

After completion of the package dicing, the contour of the individual packages (devices) is almost completed. The top view of it is shown in FIG. 15. A simplified cross-sectional view of FIG. 15 is shown in FIG. 16. As illustrated in FIGS. 15 and 16, the side surface of the resin sealing body 3 (device package) is comprised of an upper inclined side surface 3s (angle to a perpendicular line is, for example, about 20°) having a relatively sharp inclination and a lower perpendicular side surface 3v. In this drawing, the bottom surface 3b of the package is flat, but as will be described later referring to FIGS. 19, 23, and 26, when a film is used, the bottom surface 3b of the sealing body is slightly retreated from the back surface 8 of the die pad and the terminal portion 10. Such a retreat on the back surface of the package contributes to improvement in mounting of the terminal portion 10.

The back surface 3b (bottom surface or terminal surface) of the device package 3 is shown in FIG. 17. As illustrated in FIG. 17, the terminal portions 10 are dispersed and exposed in a zigzag form relative to each side.

Further, a perspective view of the device package 3 is shown in FIG. 18. What is exposed from the perpendicular side surface 3v of the resin sealing body 3 is a cutting plane of the lead 4 that has remained on the side of the resin sealing body 3 after dicing, that is, the side-surface exposed portion 4s.

2. Description on a Resin Molding Apparatus and a Mold Die to be Used in the Manufacturing Method of a Semiconductor Device According to the First Embodiment of the Present Application (Mainly, from FIG. 19 to FIG. 22)

In this section, transfer molding using a sheet (laminate film) on one side will be described in detail. In the first embodiment, a sheet is necessary because the leadframe is exposed from one of the surfaces of the sealing body. When a leadframe is exposed neither from the top surface nor the bottom surface of the sealing body or it is free from the problems such as resin burr, the sheet is not indispensable.

An example of a mold die set having, only in the lower mold die thereof, a recess configuring a cavity will be described herein in detail. It is however needless to say that the below-described example can be applied to a mold die set having, only in the upper mold die thereof, a recess configuring a cavity or a mold die set having, in both the upper and lower mold dies thereof, a recess configuring a cavity.

Figure 19:
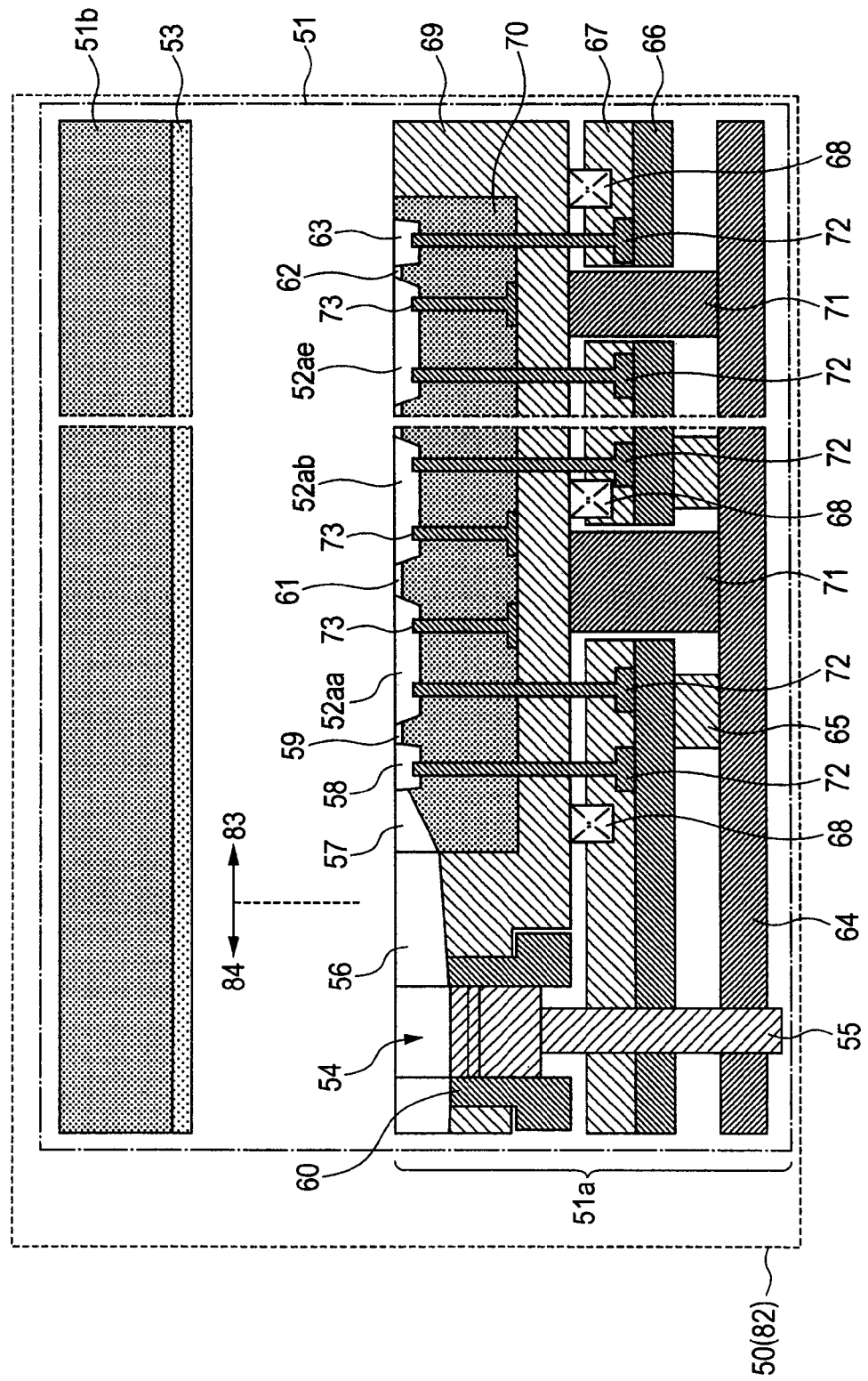
FIG. 19 is a schematic cross-sectional view in the vicinity of a mold die of a resin molding apparatus to be used for the manufacturing method of a semiconductor device according to the first embodiment.
Figure 20:
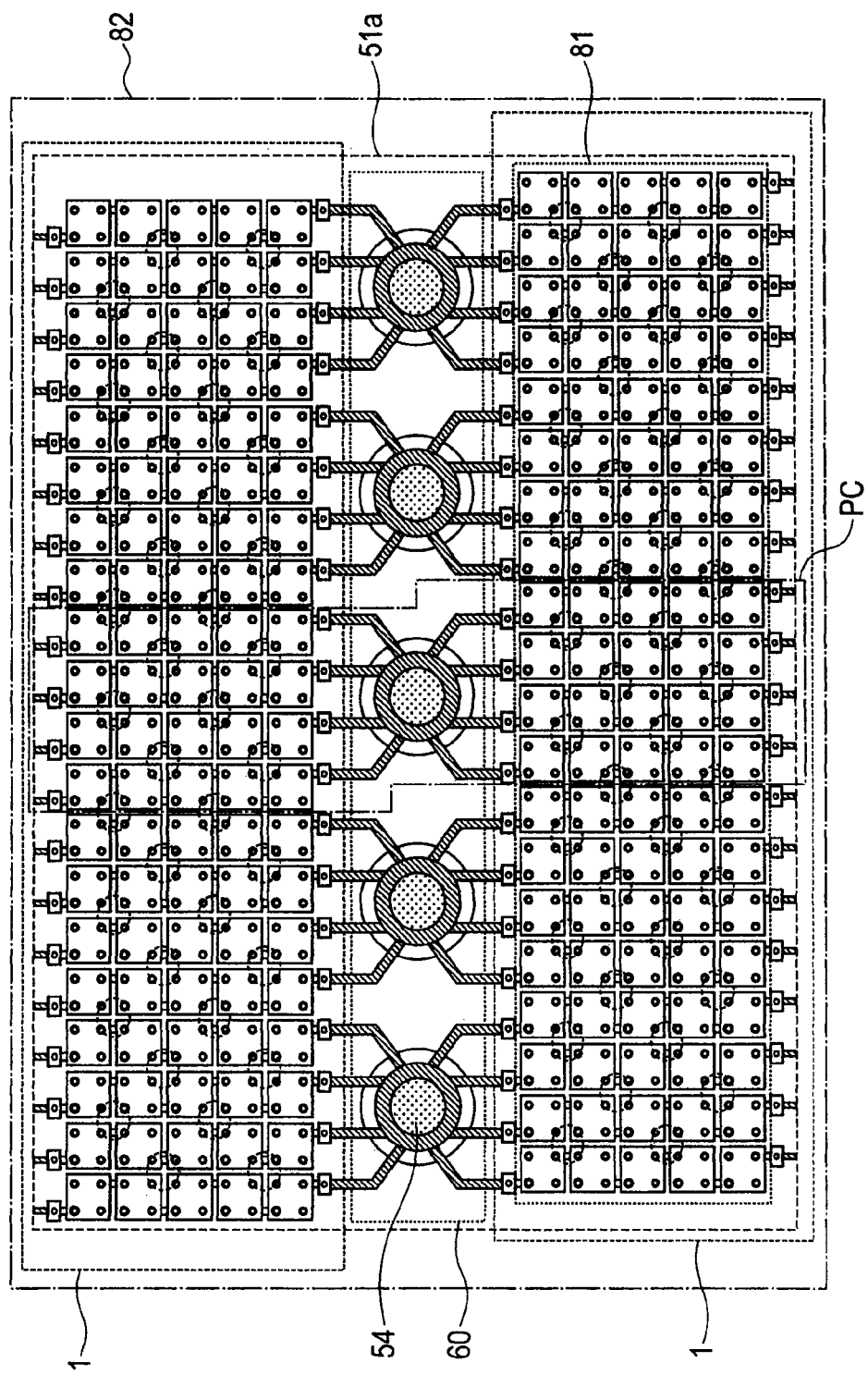
FIG. 20 is an overall top view (a secondary structure around it is omitted) of the lower mold die 51a of the press unit 82 of the resin molding apparatus of FIG. 19.
Figure 21:
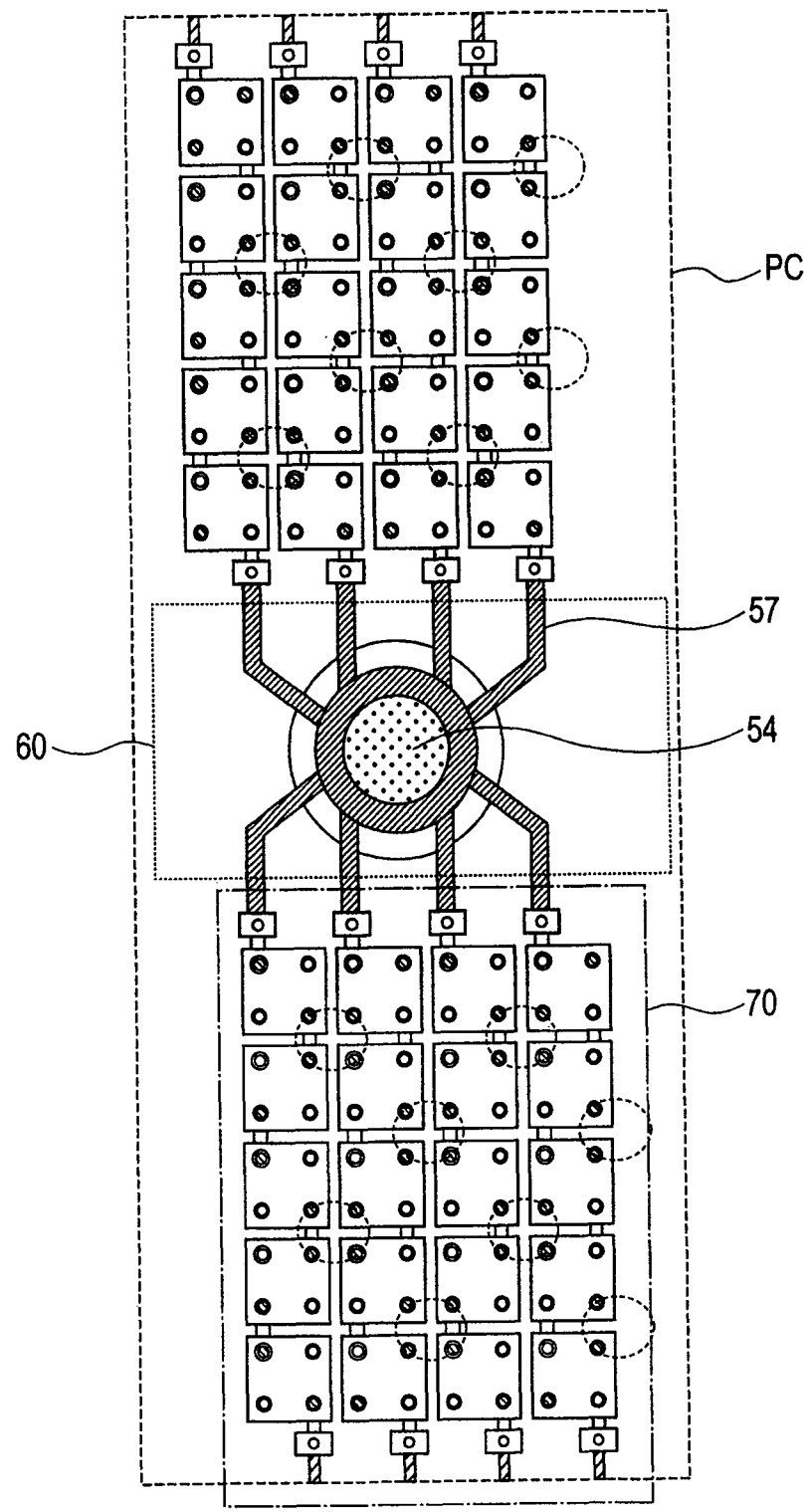
FIG. 21 is an overall top view of the pot & cavity unit region PC of FIG. 20.
Figure 22:
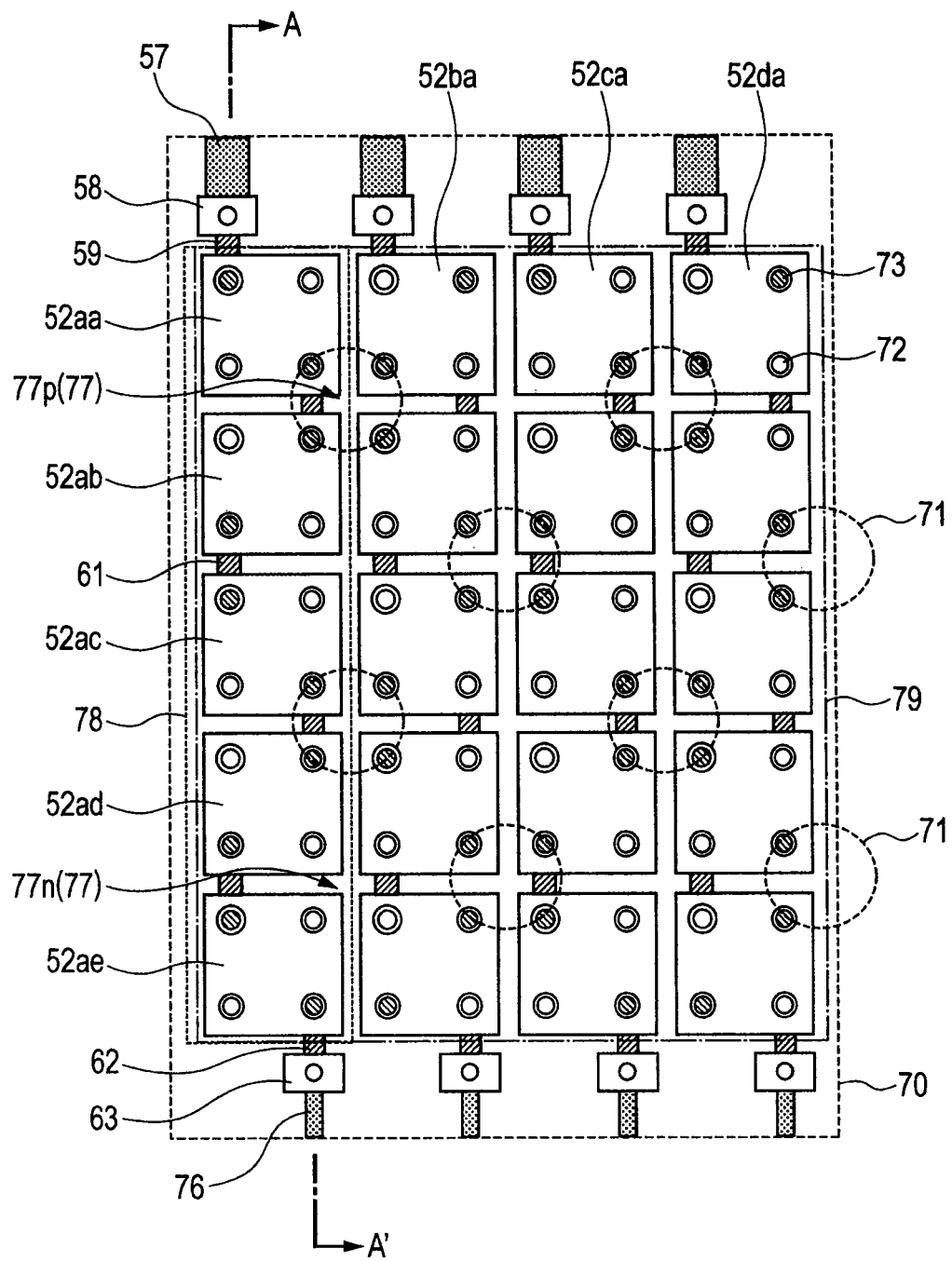
FIG. 22 is an enlarged top view of the cavity block 70 of FIG. 21.

FIG. 19 is a schematic cross-sectional view showing the vicinity of a mold die set of a resin molding apparatus to be used in the manufacturing method of a semiconductor device according to the first embodiment of the present application. FIG. 20 is an overall top view (secondary structure around it is omitted) of a lower mold die 51a of a press unit 82 of the resin molding apparatus of FIG. 19. FIG. 21 is an overall top view of the pot & cavity unit region PC of FIG. 20. FIG. 22 is an enlarged top view of the cavity block 70 of FIG. 21. Based on these drawings, the resin molding apparatus and the mold die set to be used in the manufacturing method of a semiconductor device according to the first embodiment of the present application will next be described.

First, the outline of the structure of the mold die set 51 (or press unit 82) of a resin molding apparatus 50 will be described referring to the cross-sectional view. As illustrated in FIG. 19, the upper mold die 51b retains, on the flat bottom surface thereof, a sheet 53 (laminate film) thereto by vacuum adsorption or the like. On the other hand, the lower mold die 51a is fabricated on a base plate 64 which is a portion thereof and it has two regions, that is, a cavity region 83 and a pot region 84 in a planar view. The pot region 84 (including a boundary region) has therein a pot block 60 having a plunger 55. The pot block 60 has, in the upper portion thereof, a pot 54 and a cull 56. The sheet 53 (laminate film) is used because it can prevent generation of flash and burrs on the back surface 1b of the leadframe 1 and can provide a small space between the sheet and the bottom surface 2b of the sealing body 3, the back surface 8 of the die pad, and the terminal portion 10. Preferred examples of the laminate film 53 include fluorine-based laminate films (fluorine-resin based release films, for example, an ethylene-tetrafluoroethylene film having a thickness of, for example, from about 30 to 50 μm) which are thermoplastic resins. The sheet 53 has desirably a melting point of 200° C. or greater but less than 300° as a material quality. From the practical viewpoint (cost is also taken into consideration), the melting point is suitably 250° C. or greater but less than 300° C. (the upper limit of the melting point may be neglected when the price of the resin is not limited). A fluorine-based laminate film has typically a melting point of from about 260° C. to 270° C.

In the cavity region 83, an ejector stopper 65 for determining the return limit of the ejector pin 72 (movable ejector pin) is placed on the base plate 64. The ejector stopper has thereover an ejector backing plate 66 for driving the movable ejector pin 72. The ejector backing plate has thereover an ejector pin supporting plate 67 for retaining the movable ejector pin 72 and an ejector pin return spring 68.

The base plate 64 has thereon a plurality of support pillars 71, which penetrate through the ejector backing plate 66 and the ejector pin supporting plate 67 and support a cavity block holder 69. The cavity block holder 69 has a cavity block 70 set thereon. On the cavity block holder 69, a plurality of fixed ejector pins 73 (pseudo ejector pins for blocking ejector pin through-holes not used) are set while penetrating through the cavity block 70. The cavity block 70 has, on the upper surface thereof, a runner 57, a gate cavity 58, an injection gate 59, a plurality of mold cavities 52aa, 52ab, and 52ae, a flow gate for discharging an excess molten resin, and a flow cavity 63 for receiving the discharged resin. These fixed ejector pins 73 and holes for housing therein are provided for the purpose of unifying their outer diameter or manage a process while using the pins for indexing.

Next, a top view of a transfer molding unit 82 of the lower mold die 51a of FIG. 19 is shown in FIG. 20. As illustrated in FIG. 20, the transfer molding unit 82 has a pot block 60 having a plurality of pots housed therein and a one-side matrix-state cavity group 81 including many mold cavities 52 in matrix form. When an attention is paid to one of the pots 54 and mold cavities 52 related thereto, the transfer molding unit 82 can be divided into a plurality of pot & cavity unit regions PC.

FIG. 21 is an enlarged plan view of the pot & cavity unit region PC. As illustrated in FIG. 21, in this example, one of the pot & cavity unit regions PC is comprised of a pot block 60 including a pot 54, a runner 57, and the like, a pair of cavity blocks 70 (having a plurality of mold cavities 52 in a two-dimensional matrix form), and the like.

FIG. 22 shows an enlarged top view of the cavity block 70 and the vicinity thereof. As illustrated in FIG. 22, the cavity block 70 has a unit matrix-state cavity group 79 as a main portion and this unit matrix-state cavity group 79 is comprised of a plurality of cavity columns 78. For example, the cavity column 78 including a mold cavity 52aa (size: for example, a 9 mm square) is comprised of a plurality of mold cavities 52aa, 52ab, 52ac, 52ad, and 52ae. Each of the cavity columns 78 has, at one of the end portions thereof (on the side from which the molten resin is supplied), a runner 57, a gate cavity 58, an injection gate 59, and the like. It has, at the other end portion thereof (on the side from which the molten resin is discharged), a flow gate 62, a flow cavity 63, an air vent 76, and the like. Further, the mold cavities 52 of each of the cavity columns 78 are linked to each other in series via a through gate 61 (having a size of, for example, about 0.3 mm in depth and about 0.6 mm in width). It is desired to link them at positions to give a zigzag pattern. Linking in a zigzag manner is not essential, but it can reduce the number of voids. The number of mold cavities configuring each of the cavity columns 78 is preferably from 4 to 10 in consideration of filling properties and mass-production efficiency. In products required to satisfy severe filling properties, the number is more preferably from 4 to 6.

When in the unit matrix-state cavity groups 79, the center of four mold cavities 52 adjacent to each other is designated as a cavity corner portion (the distance between the cavities is, for example, about 0.4 mm), an orthogonal grid of the cavity corner portion 77 having a lattice constant similar to the alignment of the mold cavities 52 in the unit matrix-state cavity group 79 is formed. The support pillars 71 (having a diameter of, for example, about 8 mm) are placed at every other grid point of the orthogonal grid of the cavity corner portion 77 so that two support pillars 71 adjacent to each other are located diagonally with the mold cavity 52 therebetween. This means that when transfer is made between the mold cavities 52 without repeatedly passing through the same position between the mold cavities 52, alternate passage through the cavity corner portion 77p where the support pillar 71 has been placed and the cavity corner portion 77n where the support pillar 71 has not been placed occurs.

In this example, each of the mold cavities 52 has, in the vicinity of each of the corners thereof, four ejector pins (including dummy ejector pins) in the same orientation. Two of them are movable ejector pins 72 (which actually serve as an ejector pin) and the remaining ones are fixed ejector pins 72 (which do not actually serve as an ejector pin). The movable ejector pins 72 are provided diagonally. This means that a diagonal line including the pair of movable ejector pins 72 and a diagonal line including the pair of adjacent support pillars 71 do not belong to the same diagonal line so as to prevent the pair of the movable ejector pins 72 from planarly overlapping with the support pillars 71. The fixed ejector pin 73 is therefore provided adjacent to the cavity corner portion 77p where the support pillar 71 is. Such an arrangement is not essential but it can efficiently secure a space for placing the support pillar 71 therein while ensuring good release properties.

It is needless to say that the fixed ejector pin 73 is not necessary when there are only ejector pin holes for the movable ejector pins. The number of the movable ejector pins 72 may be one per each mold cavity 52 but an increase of it to two can ensure better release properties.

Incidentally, the flow gate 62, flow cavity 63, and the like are not essential, but they are effective for reducing the number of voids or improving the filling properties.

3. Description of a Resin Molding Process in the Manufacturing Method of a Semiconductor Device According to the First Embodiment of the Present Application (Referring Mainly to FIGS. 23 to 26)

With the schematic fragmentary cross-section substantially corresponding to the line A-A' of FIG. 22 described in section 2 as an example, a description will next be made on the details of the transfer molding process described in section 1.

Figure 23:
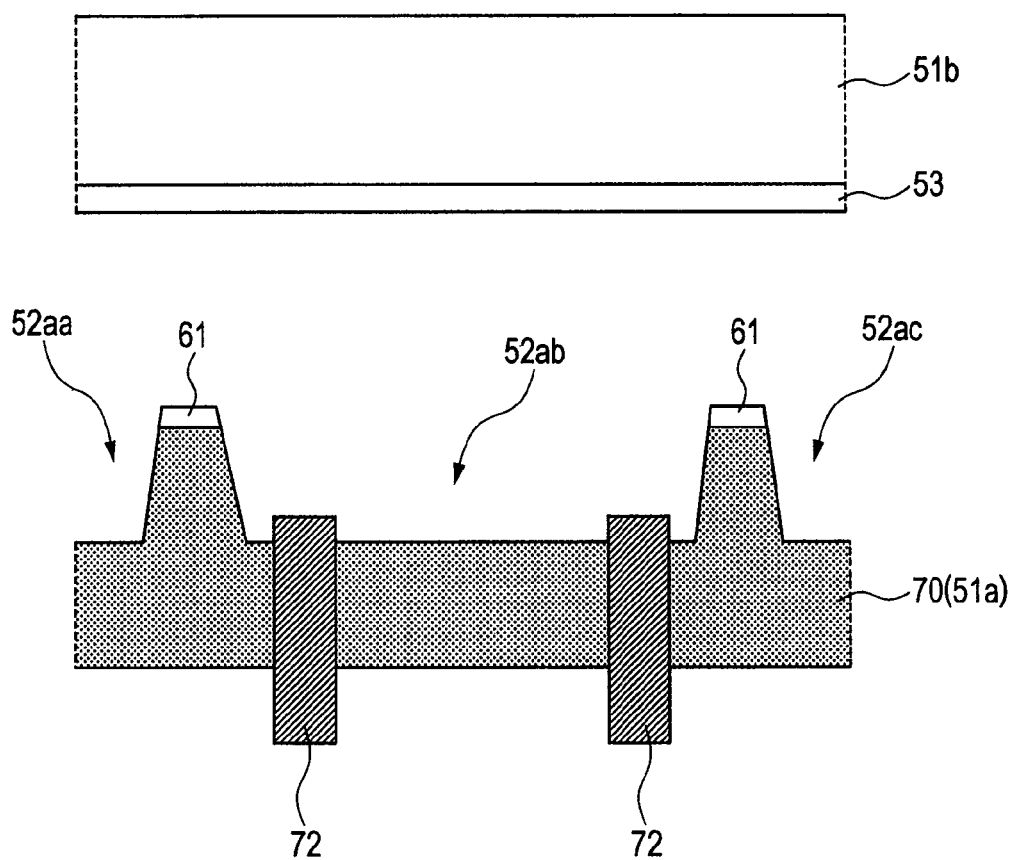
FIG. 23 is a fragmentary schematic cross-sectional view including the upper mold die which view substantially corresponds to the A-A' cross-section of FIG. 22 (before a leadframe is installed)
Figure 24:
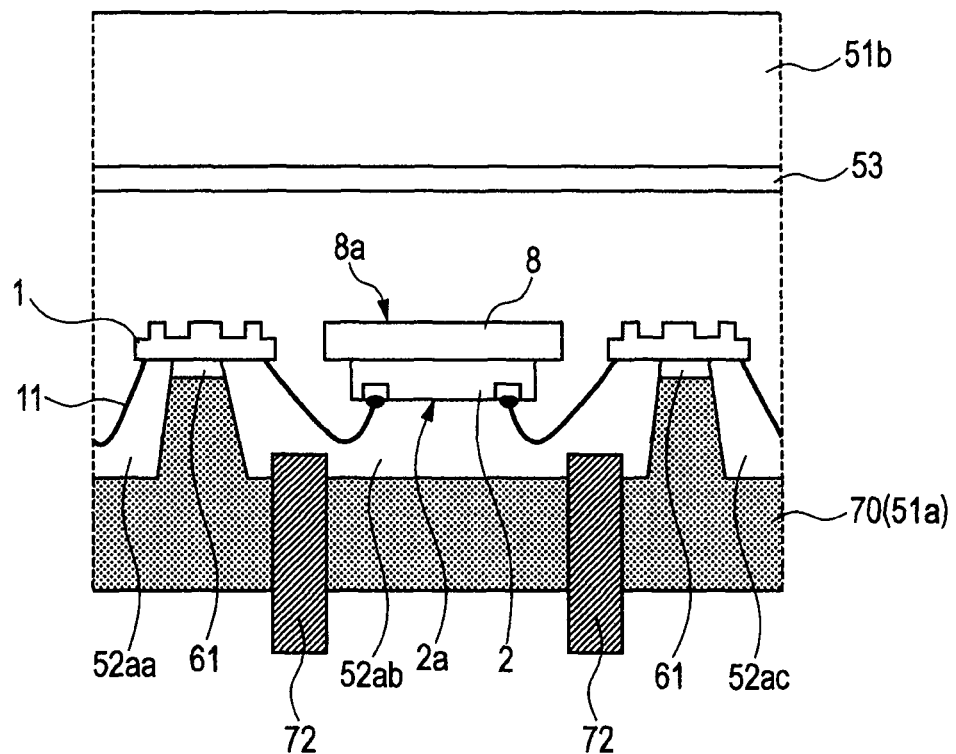
FIG. 24 is a fragmentary schematic cross-sectional view including the upper mold die which view substantially corresponds to the A-A' cross-section of FIG. 22 (leadframe installing step)
Figure 25:
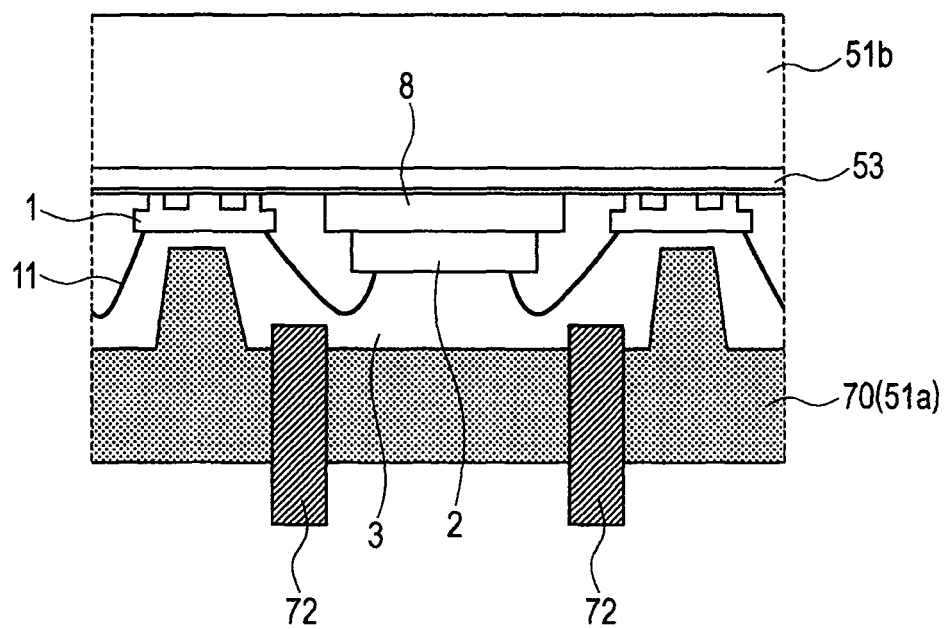
FIG. 25 is a fragmentary schematic cross-sectional view including the upper mold die which view substantially corresponds to the A-A' cross-section of FIG. 22 (when mold die clamping and resin filling are completed)
Figure 26:
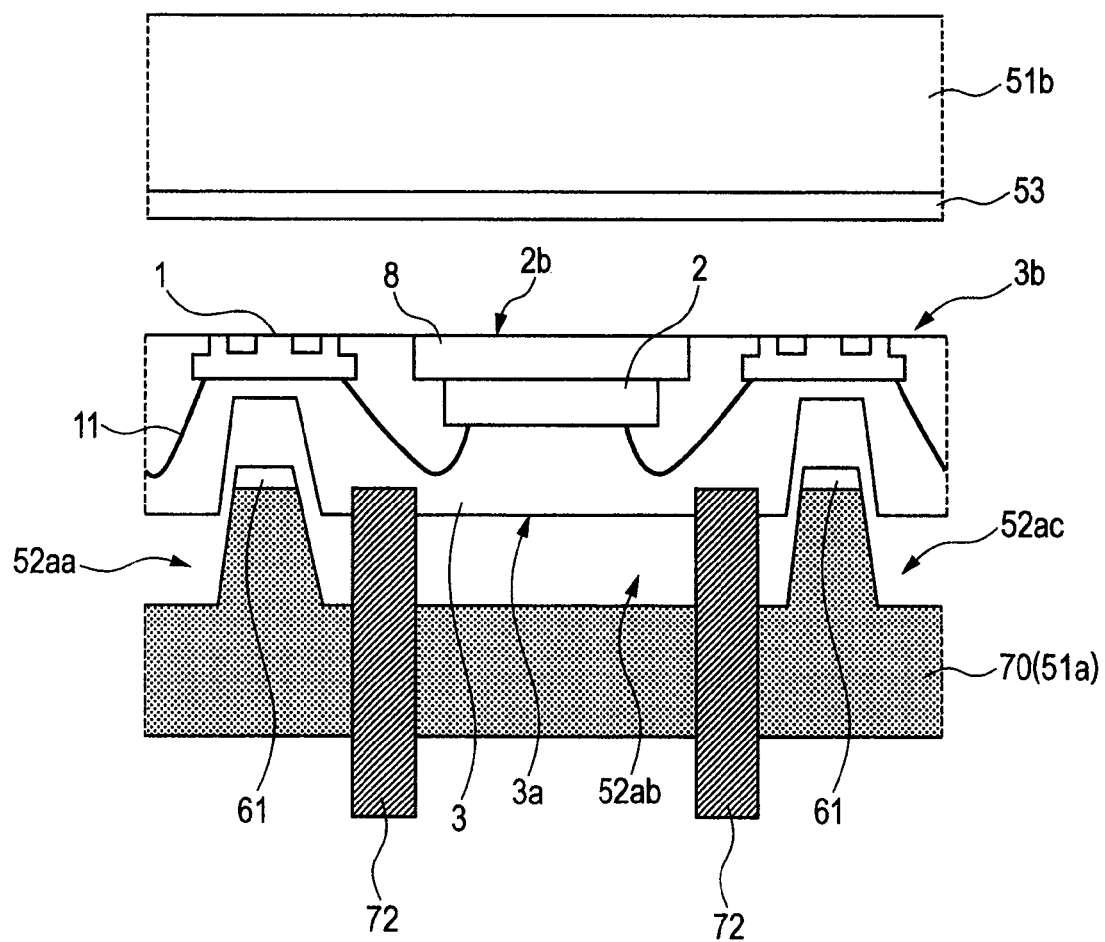
FIG. 26 is a fragmentary schematic cross-sectional view including the upper mold die which view substantially corresponds to the A-A' cross-section of FIG. 22 (when mold die opening and releasing are completed).

FIG. 23 is a fragmentary schematic cross-sectional view including the upper mold die which view substantially corresponds to the A-A' cross-section of FIG. 22 (before a leadframe is installed). FIG. 24 is a fragmentary schematic cross-sectional view including the upper mold die which view substantially corresponds to the A-A' cross-section of FIG. 22 (leadframe installing step). FIG. 25 is a fragmentary schematic cross-sectional view including the upper mold die which view substantially corresponds to the A-A' cross-section of FIG. 22 (when mold die clamping and resin filling are completed). FIG. 26 is a fragmentary schematic cross-sectional view including the upper mold die which view substantially corresponds to the A-A' cross-section of FIG. 22 (when mold die opening and releasing are completed). Based on these drawings, the resin molding process in the manufacturing method of a semiconductor device according to the first embodiment of the present application will next be described.

As illustrated in FIG. 11, the leadframe 1 is transferred to the molding apparatus 50 when the wire bonding step is completed. FIG. 23 shows a mold die which is opened prior to the insertion of the leadframe 1. As illustrated in FIG. 23, the upper mold die 51b and the lower mold die 51a (cavity block 70) are apart from each other.

Then, as illustrated in FIG. 24, the leadframe 1 is set on the lower mold die 51a so that the unit device regions 5 correspond to the cavities 52aa, 52ab, and 52ac, respectively while the leadframe 1 is inverted (while turning the semiconductor chip side of the leadframe down).

Then, as illustrated in FIG. 25, a sealing resin is filled in all the cavities 52 through the pot 54, the cull 56, the runner 57, the gate cavity 58, the injection gate 59, the cavity 52, the through-gate 61, and the like while sandwiching the leadframe 1 between the upper mold die 51b and the lower mold die 51a (under a clamped condition or under a mold-die closed condition). As a result, a sealing body 3 is formed.

Then, as illustrated in FIG. 26, the top mold die 51b and the bottom mold die 51a are opened, the ejector backing plate 66 ascends to push up the movable ejector pin 72 and separate the resin molding body 3 (leadframe 1) from the lower mold die 51a. Then, the leadframe 1 encapsulated with the resin sealing body 3 is taken out from between the upper mold die 51b and the lower mold die 51a. The leadframe taken out from the mold die is as illustrated in FIGS. 11 and 12.

4. Conclusion and Supplementary Description on Embodiments

As described above, there are two molding systems of a QFN package, that is, individual molding system (or chip-scale molding system) and batch molding system (or MAP system). The system used in the above embodiment is a system belonging to the intermediate system of them. It is sometimes called "SEMI-MAP" system. In this SEMI-MAP system, it is typical to carry out transfer molding with a mold die in which a plurality of cavity columns—each comprised of a plurality of cavities linked in series via a through-gate—have been arranged in rows. After molding, the molded body is divided into individual devices by dicing or the like. If necessary, a portion of the sealing body is removed upon separation.

In the individual molding system, die bonding, wire bonding, resin molding and the like are performed while attaching a film to the back surface of a lead frame in order to prevent flash and burrs from appearing on the surface of the lead (lead film-attaching system), which, however, increases the cost of the leadframe. In addition to this disadvantage, it needs a film peeling step prior to plating of the lead after molding. As a film to be used in the lead film-attaching system (which is called "back tape"), a laminate film made of a heat-resistant polymer resin (for example a thermosetting polyimide resin having a glass transition point of 315° C. or greater) having a glass transition point of usually 250° C. or greater, preferably 300° C. or greater is ordinarily used in order to withstand heat treatment of 200° C. or greater (for example, wire bonding performed at about 230° C.) Such a heat-resistant polymer resin is however expensive. In addition, since it is a thermosetting resin, it is hard to recycle compared with thermoplastic resins.

In the batch molding system, on the other hand, after a large number of unit device regions are sealed as a single rectangular sealing body, the single rectangular sealing body is divided into individual devices by using dicing. The number of devices available increases, but a large burden is imposed on a dicing blade, which increases a process cost. In addition, since the area of the sealing body is large, a laminate film becomes indispensable for separating the rectangular sealing boy formed on a leadframe, which increases the process cost further.

Furthermore, similar to the individual molding system, die bonding, wire bonding, resin molding and the like are performed while attaching a film (back tape) onto the back surface of the lead frame mainly in order to prevent flash and burrs from appearing on the back surface 1*b* of the leadframe 1. Similar problems therefore occur. Incidentally, the back tape should be attached at least prior to wire bonding (ordinarily, it is attached when the leadframe is completed) in consideration of the short circuit of a bonding wire.

In the SEMI-MAP system shown in the above embodiment, the number of devices available in this system are greater than that of the individual molding system because the runner in the cavity matrix is not necessary. In addition, when the lead film-attaching system is not employed (when only a release film exclusively used in the molding step is used or a sheet or the like is not used upon molding), the cost of the leadframe can be reduced and in addition, a film peeling step is not necessary. Further, a portion of the sealing body (for example, when the sealing body is not required to be cut through the total thickness) should often be removed upon dicing. In this case, a burden on the dicing blade can be reduced. In the back-surface lead exposed type package as described in the embodiment, that is, a package exposing the leadframe from the back surface thereof, it is effective to use a resin sheet in order to prevent resin burrs from sticking onto the exposed lead surface. At this time, a relatively heat-sensitive thermoplastic resin can be used (used only in the molding step so that the maximum temperature is a relatively low molding temperature, that is, about 175°), which leads to a reduction in the material cost and easy recycling.

5. Summary:

The invention made by the present inventors has been described specifically based on embodiments. The present invention is not limited to or by them. It is needless to say that the invention can be changed without departing from the gist of the invention.

For example, in the above embodiment, the description has been made mainly with die bonding of a semiconductor chip to a die pad as an example. The invention is not limited to it. It is needless to say that the invention can also be applied to an example in which a plurality of semiconductor chips is mounted as a single layer or a stacked layer onto a die pad.

In the above embodiment, only a wire bonding system has been described as a mounting system. It may be replaced with a flip chip system or another system using a bump electrode. It is needless to say that the wire bonding system and the bump electrode system may be used in combination. It is also needless to say that TSV (through silicon via) system may be used as a mounting system.

What is claimed is:

1. A method of manufacturing a semiconductor device, comprising the steps of:
   (a) providing a lead frame in which a plurality of unit device regions equipped with a die pad, a plurality of leads placed around the die pad, and a frame portion for supporting the die pad and the leads, the unit device regions being arranged in a two-dimensional matrix form;
   (b) fixing the back surface of a semiconductor chip having a plurality of electrode pads arranged on a surface of the semiconductor chip onto the die pad;
   (c) coupling the leads and the electrode pads via a wire;
   (d) after the step (c), forming, in a molding apparatus, a resin sealing body in each of the unit device regions by transfer molding while sandwiching the leadframe between a lower mold die and an upper mold die configuring a mold die set; and
   (e) releasing, in the molding apparatus, the leadframe encapsulated in the resin sealing body from the lower mold die or the upper mold die,
   wherein in the step (d), the mold die set comprises:
   (x1) a matrix-state cavity group in which a plurality of cavity columns obtained by linking, in series via a through gate, a plurality of mold cavities provided between the lower mold die and the upper mold die have been placed in a plurality of rows so that they correspond to the unit device regions placed in a two-dimensional matrix form;
   (x2) a movable ejector pin provided in the lower mold die to correspond to each of the mold cavities belonging to the matrix-state cavity group; and
   (x3) a plurality of support pillars provided at a plurality of cavity corner portions of the matrix-state cavity group so as not to planarly overlap with the movable ejector pin and to stride over four mold cavities surrounding therewith each of the cavity corner portions.

2. The method of manufacturing a semiconductor device according to claim 1,
   wherein the number of the mold cavities configuring the cavity column is 4 or greater but not greater than 10.

3. The method of manufacturing a semiconductor device according to claim 2,
   wherein the movable ejector pins are provided as a pair at a diagonal position, in a planar view, in each of the mold cavities belonging to the matrix-state cavity group.

4. The method of manufacturing a semiconductor device according to claim 3,
   wherein the support pillars are provided at every other cavity corner portion so as to be diagonal to each other with an adjacent mold cavity therebetween.

5. The method of manufacturing a semiconductor device according to claim 4, wherein the number of mold cavities configuring the cavity line column is 4 or greater but not greater than 6.

6. The method of manufacturing a semiconductor device according to claim 5,
wherein releasing in the step (e) is conducted through the movable ejector pin.

7. The method of manufacturing a semiconductor device according to claim 6,
wherein in the step (d), the mold die further comprises:
(x4) a pair of fixed ejector pins provided, in a planar view, at a diagonal position in the lower mold die different from the positions of the movable ejector pins, while corresponding to each of the mold cavities belonging to the matrix-state cavity group.

8. The method of manufacturing a semiconductor device according to claim 7,
wherein the fixed ejector pins are each provided adjacent to one of the cavity corner portions at which the support pillars are provided.

9. The method of manufacturing a semiconductor device according to claim 8, further comprising a step of:
(f) after the step (e), separating the lead frame into the individual unit device regions by dicing.

10. The method of manufacturing a semiconductor device according to claim 9,
wherein in the step (d), the upper mold die and the leadframe are separated from each other with a sheet.

11. A method of manufacturing a semiconductor device comprising the steps of:
(a) providing a lead frame in which a plurality of unit device regions equipped with a die pad, a plurality of leads placed around the die pad, and a frame portion for supporting the die pad and the leads, the unit device regions being arranged in a two-dimensional matrix form;
(b) fixing the back surface of a semiconductor chip having a plurality of electrode pads arranged on a surface of the semiconductor chip onto the die pad;
(c) coupling the leads and the electrode pads via a wire;
(d) after the step (c), forming, in a molding apparatus, a resin sealing body in each of the unit device regions by transfer molding while sandwiching the leadframe between a lower mold die and an upper mold die configuring a mold die set; and
(e) releasing, in the molding apparatus, the leadframe encapsulated in the resin sealing body from the lower mold die or the upper mold die,
wherein in the step (d), the mold die set comprises:
(x1) a matrix-state cavity group in which a plurality of cavity columns obtained by linking, in series via a through gate, a plurality of mold cavities provided between the lower mold die and the upper mold die have been placed in a plurality of rows so as to correspond to the unit device regions placed in a two-dimensional matrix form; and
(x2) a plurality of support pillars provided at a plurality of cavity corner portions of the matrix-state cavity group so as to stride over four mold cavities planarly surrounding therewith each of the cavity corner portions.

12. The method of manufacturing a semiconductor device according to claim 11,
wherein the number of the mold cavities configuring the cavity column is 4 or greater but not greater than 10.

13. The method of manufacturing a semiconductor device according to claim 12,
wherein the support pillars are provided at every other cavity corner portion so as to be diagonal to each other with an adjacent mold cavity therebetween.

14. The method of manufacturing a semiconductor device according to claim 13,
wherein the number of the mold cavities configuring the cavity column is 4 or greater but not greater than 6.

15. The method of manufacturing a semiconductor device according to claim 14, further comprising a step of:
(f) after the step (e), separating the leadframe into individual unit device regions by dicing.

16. The method of manufacturing a semiconductor device according to claim 15,
wherein in the step (d), the upper mold die and the leadframe are separated from each other with a sheet.

* * * * *